US012774206B2

(12) United States Patent
Liao et al.

(10) Patent No.: US 12,774,206 B2
(45) Date of Patent: Oct. 27, 2026

(54) MICROELECTROMECHANICAL DEVICE AND METHOD FOR MAKING THE SAME

(71) Applicant: Taiwan Semiconductor Manufacturing Company, Ltd., Hsinchu (TW)

(72) Inventors: Shih-Yu Liao, Hsinchu City (TW); Tsai-Hao Hung, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 622 days.

(21) Appl. No.: 18/318,698

(22) Filed: May 16, 2023

(65) Prior Publication Data

US 2024/0383743 A1 Nov. 21, 2024

(51) Int. Cl.
*B81B 7/02* (2006.01)

(52) U.S. Cl.
CPC ........ *B81B 7/02* (2013.01); *B81B 2203/0315* (2013.01); *B81C 2201/013* (2013.01); *B81C 2201/019* (2013.01); *B81C 2203/0792* (2013.01)

(58) Field of Classification Search
CPC ................ B81B 3/0075; B81B 3/0078; B81B 3/0097; B81B 3/0054; B81B 2201/0221–025; B81B 2203/0307; B81B 2203/0369–0392; B81B 7/02; B81B 2203/0136; B81C 2203/0792; B81C 1/0015
See application file for complete search history.

(56) References Cited

U.S. PATENT DOCUMENTS

| | | | | |
|---|---|---|---|---|
| 6,707,176 | B1 | 3/2004 | Rodgers | |
| 9,650,239 | B2 | 5/2017 | Chu et al. | |
| 9,850,125 | B2 | 12/2017 | Chu et al. | |
| 11,254,564 | B2 | 2/2022 | Cheng et al. | |
| 2009/0267166 | A1* | 10/2009 | Verheijden | B81C 1/00476 438/51 |
| 2010/0264498 | A1* | 10/2010 | Van Schaijk | H01G 13/00 438/52 |
| 2013/0313660 | A1 | 11/2013 | Nakatani et al. | |

(Continued)

FOREIGN PATENT DOCUMENTS

TW 202218043 A 5/2022

OTHER PUBLICATIONS

Sasaki, Minoru, et al. "Three-dimensional SOI-MEMS constructed by buckled bridges and vertical comb drive actuator." IEEE Journal of Selected Topics in Quantum Electronics 10.3 (2004): 455-461.

(Continued)

*Primary Examiner* — Jessica S Manno
*Assistant Examiner* — Sandra Milena Rodriguez Villanu
(74) *Attorney, Agent, or Firm* — Finnegan, Henderson, Farabow, Garrett & Dunner, L.L.P.

(57) ABSTRACT

A microdevice including a first pedestal, a second pedestal parallel to the first pedestal, the second pedestal comprising a first protrusion on its top surface. The device also including a conformal dielectric layer and a metal structure formed over a portion of the conformal dielectric layer. The metal structure including a first portion surrounding the first protrusion, a second portion parallel to the top surface of the polysilicon pedestal, and a third portion connecting the first portion and the second portion.

20 Claims, 27 Drawing Sheets

(56) References Cited

U.S. PATENT DOCUMENTS

| | | | | |
|---|---|---|---|---|
| 2015/0076626 | A1* | 3/2015 | Nakamura | H01G 5/18 438/52 |
| 2015/0340968 | A1* | 11/2015 | Inaba | B81C 1/00293 310/300 |
| 2020/0067425 | A1 | 2/2020 | Tsai et al. | |
| 2021/0215550 | A1* | 7/2021 | Hung | B81C 1/00944 |
| 2022/0157929 | A1 | 5/2022 | Lin et al. | |

OTHER PUBLICATIONS

Xie, Huikai, and Gary K. Fedder. "Vertical comb-finger capacitive actuation and sensing for CMOS-MEMS." Sensors and Actuators A: Physical 95.2-3 (2002): 212-221.

Chiou, Jin-Chern, Yung-Jiun Lin, and Chin-Fu Kuo. "Extending the traveling range with a cascade electrostatic comb-drive actuator." Journal of Micromechanics and Microengineering 18.1 (2007): 015018.

* cited by examiner

100

900

2300

2450

2400

MICROELECTROMECHANICAL DEVICE AND METHOD FOR MAKING THE SAME

TECHNICAL FIELD

The disclosure relates to a semiconductor device and a method for fabricating it. In particular, the disclosure relates to semiconductor microdevices used as sensors, actuators, and/or drives in microelectromechanical systems (MEMS).

BACKGROUND

Microelectromechanical systems (MEMS), also identified as micro-electro-mechanical systems (or microelectronic and microelectromechanical systems), refer to the technology of microscopic devices, particularly those with moving parts. MEMS frequently have multiple components, including microelectronics, microstructures, and microtransducers that are engineered to perform specific functions and in certain instances as part of more complex systems. Well known applications of MEMS devices include inkjet printers, accelerometers, and digital light processing.

Most MEMS devices include some kind of sensors and/or actuators (sometimes referred together as transducers or drives) that are necessary for their operation. These transducers are frequently built as part of the MEMS and are designed to convert power from one form to another form, for purposes of measurement, sensing, actuation, and/or control. Frequently, the MEMS transducers are electro-mechanical, converting mechanical motion or stress into an electrical output or converting electrical inputs into movement. Common electro-mechanical transducers include piezo-electrics, comb-drives (also known as interdigitated actuators), cantilevers, and/or resonators.

Among the various transducers, the comb-drive (which may also be referred to as the MEMS drive) has been used in different MEMS applications. The comb-drive utilizes electrostatic forces between electrically conductive combs or fingers to transduce electrical movement into voltages or voltages into movement. For example, applying a voltage in a comb-drive causes combs to move based on electrostatic and capacitive forces that move the combs together or further apart. Alternatively, the movement of the combs and distance between them can generate electrical outputs that indicate acceleration, movement, and/or force. The comb-drive transducers are included in multiple applications including accelerometers, gyroscopes, and micro grippers.

Traditional comb- or MEMS-drives, however, have limitations. Traditional MEMS-drives frequently have a narrow range, limiting their sensitivity and ultimately their dynamic range. They are also prone to failure caused by vibration, and may have small conductivity, which may limit their sensitivity and actuation.

The disclosed devices, apparatuses, and methods of fabrication are directed to addressing one or more problems or challenges in the prior art.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
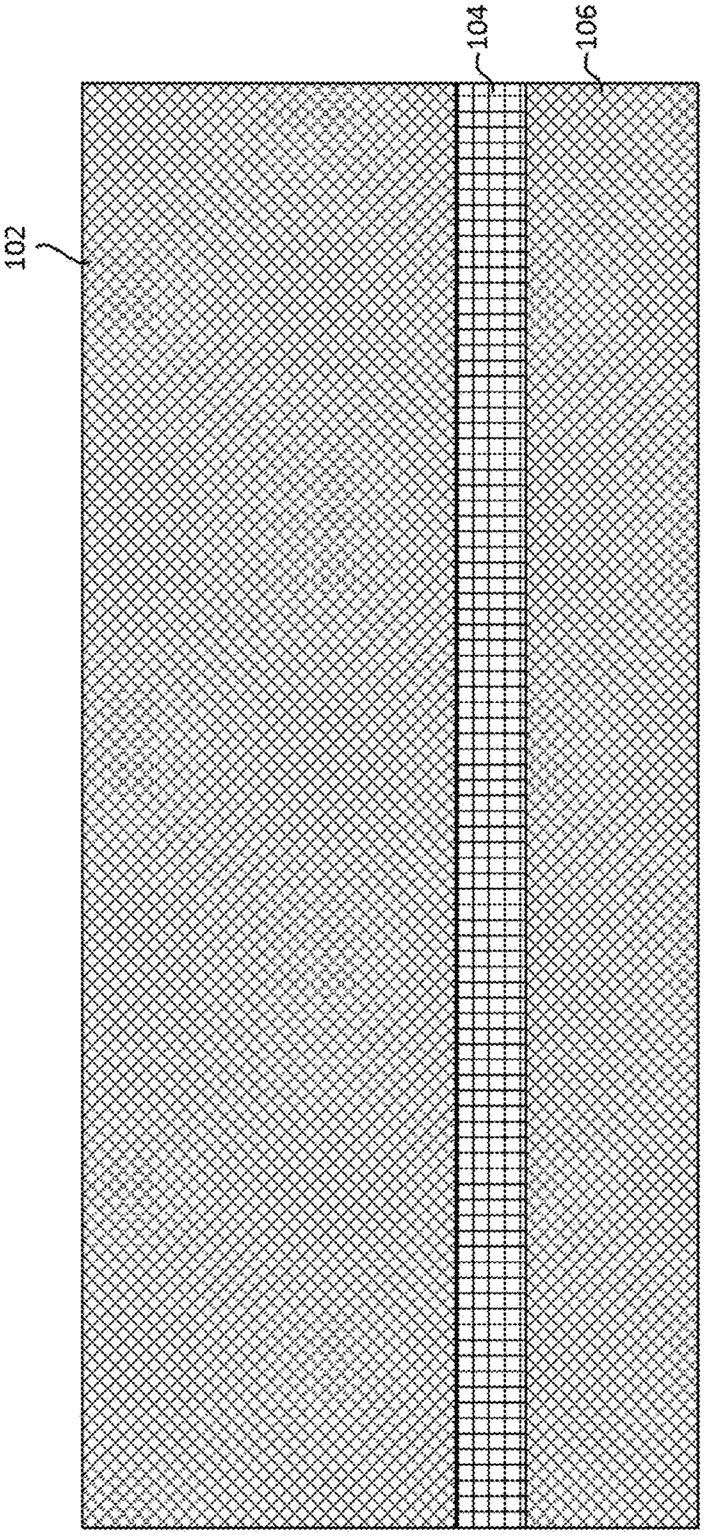
FIG. 1 shows a cross-sectional view of a first structure formed during an exemplary manufacturing process for forming a MEMS-drive in accordance with embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, connectivity terms such as "connected," "coupled," "joined," "attached," and the like, may be used herein for ease of description to describe elements that have an electrical, electromagnetic, radio frequency, or ultrasonic connectivity. Moreover, connectivity terms may denote general electrical or magnetic communication between components. These connectivity terms may denote a direct connection (i.e., two components being connected without any intervening element) or an indirect connection (i.e., two components being connected through one or more intervening elements).

FIG. 1 shows a cross-sectional view of a first structure 100 formed during an exemplary manufacturing process for forming a MEMS-drive in accordance with embodiments of the present disclosure. As shown in FIG. 1, first structure 100 may include a device layer 102, an insulator layer 104, and a handle layer 106.

In some embodiments, device layer 102 and handle layer 106 may be of the same material while insulator layer 104 may be of a different material. For example, while device layer 102 and handle layer 106 may be of silicon, insulator layer 104 may be formed with silicon oxide. However, other materials and combinations may be used for first structure 100. For example, each one of device layer 102, insulator layer 104, and handle layer 106 may be formed with a different material. In some embodiments, device layer 102 and handle layer 106 may be formed of a semiconductor material while insulator layer 104 is formed with an oxide, a nitride, or a similar insulating material.

While FIG. 1 shows relative thicknesses for each layer, alternative thickness configurations may be used. For example, while device layer 102 is shown as the thickest among the three shown layers, certain embodiments may have handle layer 106 as the thickest layer and/or insulator layer 104 being the thickest layer. Additionally, or alternatively, the layers may have similar thicknesses among them. For example, the thicknesses of each layer may each be in a range between 1 um and 1 mm.

In some embodiments, device layer 102 may have a thickness of about 200 um (e.g., 200 um+/−5 um) while handle layer 106 may have a thickness of about 500 um (e.g., 500 um+/−10 um).

In some embodiments first structure 100 may be a silicon-on-insulator (SOI) wafer. In such embodiments, first structure 100 may be formed with SIMOX (Separation by IMplantation of Oxygen), Wafer bonding, NanoCleave, ELTRAN, and Seed methods, among others.

Figure 2:
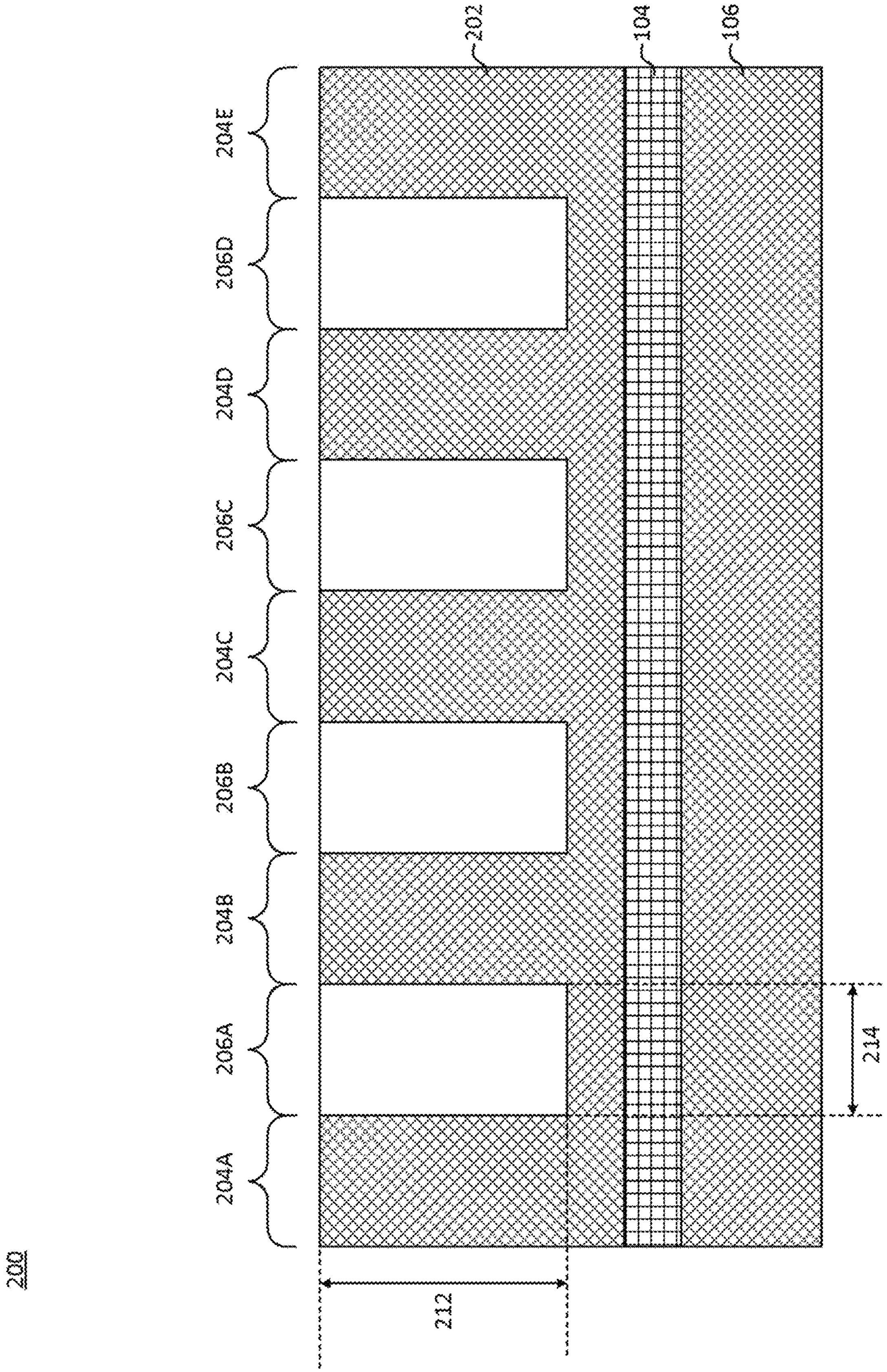
FIG. 2 shows a cross-sectional view of a second structure formed during the exemplary manufacturing process for forming a MEMS-drive.

FIG. 2 shows a cross-sectional view of a second structure 200 formed during the exemplary manufacturing process for forming a MEMS-drive. As shown in FIG. 2, second structure 200 includes handle layer 106, insulator layer 104, and an etched layer 202 that has unetched sections 204A-204E and etched sections 206A-206D.

In some embodiments, second structure 200 may be formed by etching device layer 102 of first structure 100. For example, using a sequence of photolithography and etching, device layer 102 may be selectively etched to form etched sections 206A-206D. These etched sections 206A-206D are trenches in device layer 102 and they may be formed using different etching processes. For example, in some embodiments etched sections 206A-206D may be formed through Deep reactive-ion etching (DRIE). DRIE is a highly anisotropic etch process used to create deep penetration, steep-sided holes and trenches in wafers/substrates, typically with high aspect ratios. In other embodiments, etched sections 206A-206D may be formed using ion sputtering, wet etching, and/or different types of plasma etching. In yet other embodiments, etched sections 206A-206D may be formed through mechanical etching of device layer 102.

Formation of etched sections 206A-206D may involve the fabrication of a hard mask to protect certain areas of device layer 102 while leaving other areas exposed. For example, a hard mask made of silicon oxide may be employed to create a mask for the selective etch of trenches into device layer 102. In such embodiments, a dielectric layer (e.g., an oxide layer may) be grown on the device layer (e.g., though thermal oxidation) that is then patterned with photolithography techniques to generate a hard mask.

Etched sections 206A-206D may be formed as trenches having a depth that is determined based on the thickness of device layer 102. For example, the depth of etched sections 206A-206D may be 20-90% of the thickness of device layer 102. Additionally, or alternatively, the depth of etched sections 206A-206D may be set to a range between 0.5-10 um. In some embodiments etched sections 206A-206D may be etched to a trench depth 212 and having a trench width 214. Trench depth 212 may be between 10 um to 1 mm and trench width may be between 0.5 and 100 um. For example, in some embodiments trench depth 212 may be about 200 um (e.g., 200 um+/−5 um) while trench width 214 may be about 10 um (e.g., 10 um+/−2 um).

In some embodiments, the etching process to form second structure 200 may have a high aspect ratio, as shown in FIG. 2. In other embodiments, however, the profile of the walls in etched sections 206A-206D may be different. For example, walls etched sections 206A-206D may have a slope, may be concave, and/or convex.

Figure 3:
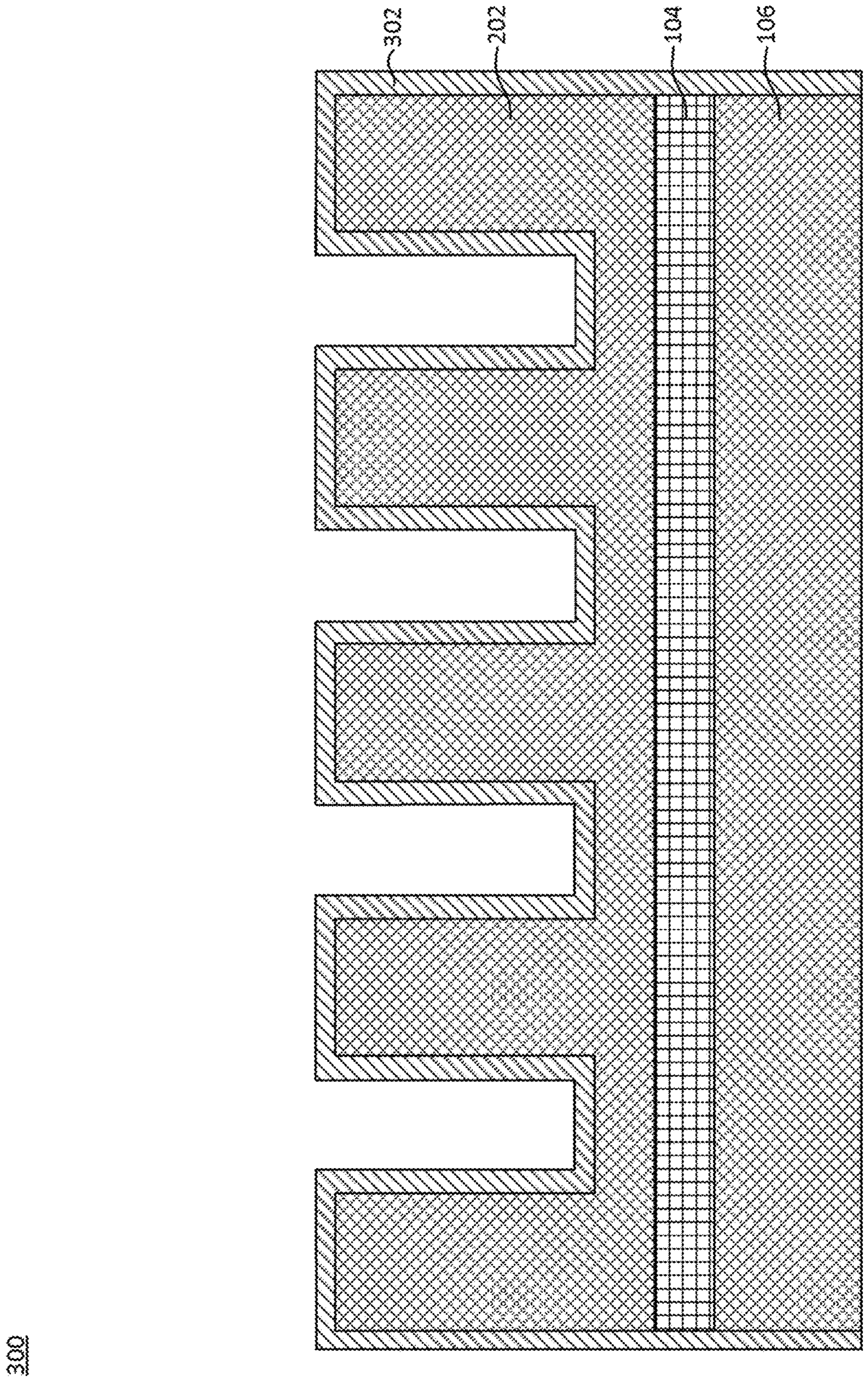
FIG. 3 shows a cross-sectional view of a third structure formed during the exemplary manufacturing process for forming a MEMS-drive.

FIG. 3 shows a cross-sectional view of a third structure 300 formed during the exemplary manufacturing process for forming a MEMS-drive. As shown in FIG. 3, third structure 300 may include handle layer 106, insulator layer 104, etched layer 202, and a first conformal insulator 302.

In some embodiments, third structure 300 may be formed by oxidizing second structure 200. For example, etched layer 202 may be thermally oxidized to form first conformal insulator 302. Additionally, or alternatively, a conformal layer may be deposited over etched layer 202. For example, through processes such as chemical vapor deposition (CVD), first conformal insulator 302 may be deposited over etched layer 202. In such embodiments, different types of CVD processes may be employed for the formation of first conformal insulator 302. For example, first conformal insulator 302 may be fabricated with atmospheric pressure CVD (APCVD), low-pressure CVD (LPCVD), Ultrahigh vacuum CVD (UHVCVD), and/or sub-atmospheric CVD (SACVD). Additionally, or alternatively, the CVD process used for first conformal insulator 302 may include aerosol assisted CVD (AACVD), direct liquid injection CVD (DLICVD), microwave plasma-assisted CVD (MPCVD), plasma-enhanced CVD (PECVD), Remote plasma-enhanced CVD (RPECVD), Low-energy plasma-enhanced chemical vapor deposition (LEPECVD), atomic-layer CVD (ALCVD), combustion chemical vapor deposition (CCVD), or hot filament CVD (HFCVD).

Additionally, or alternatively, the deposition of first conformal insulator 302 may include hybrid physical-chemical vapor deposition (HPCVD), metalorganic chemical vapor deposition (MOCVD), rapid thermal CVD (RTCVD), Vapor-phase epitaxy (VPE), Photo-initiated CVD (PICVD), and Laser chemical vapor deposition (LCVD).

First conformal insulator 302 may have different thicknesses ranging from 20 nm to 1000 nm. More particularly, depending on the application, edge roughness, and/or processing constraints, first conformal insulator 302 may have different thicknesses. In some embodiments, the average thickness of first conformal insulator 302 may be of about 500 nm (e.g., 500 nm+/−100 nm).

Figure 4:
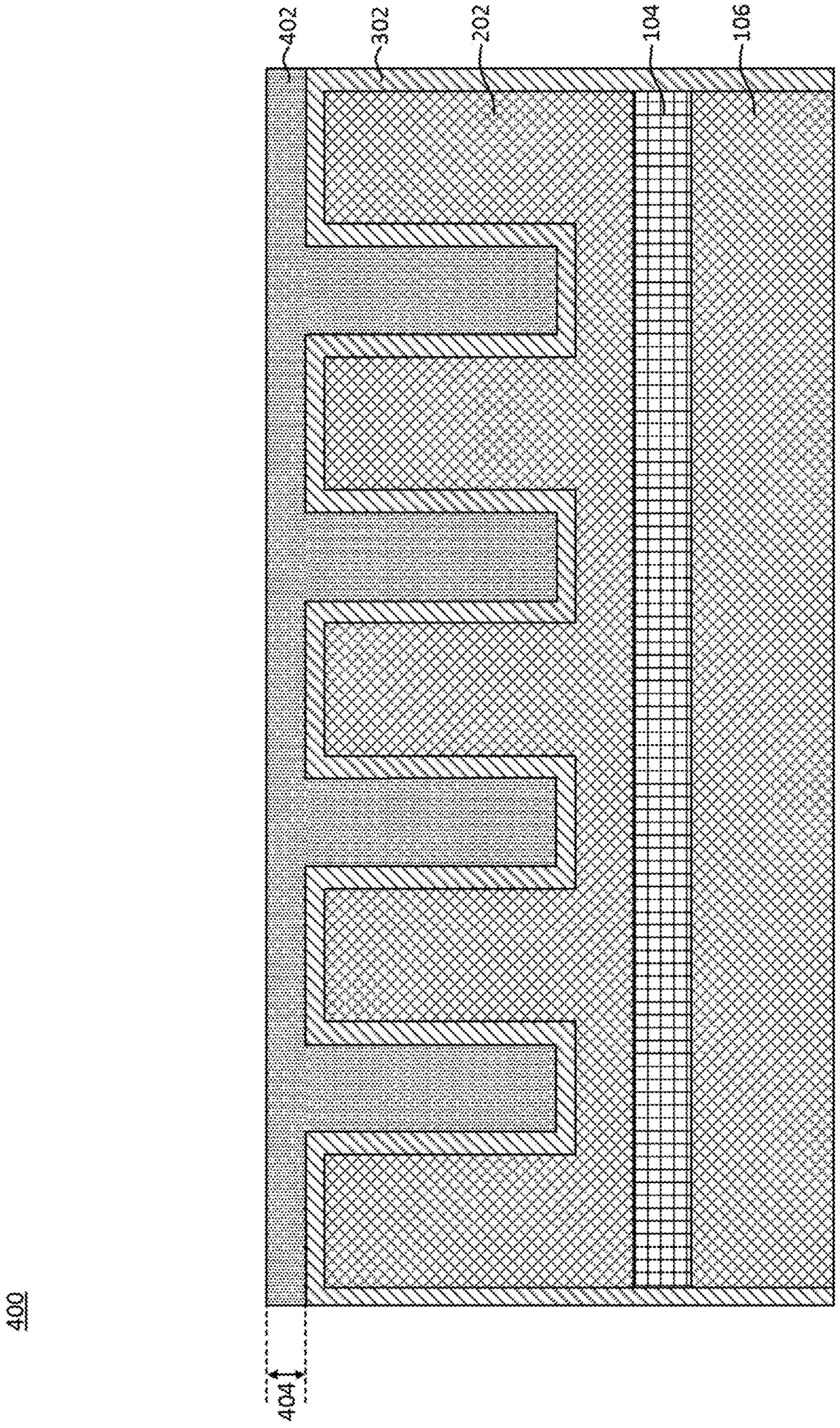
FIG. 4 shows a cross-sectional view of a fourth structure formed during the exemplary manufacturing process for forming a MEMS-drive.

FIG. 4 shows a cross-sectional view of a fourth structure 400 formed during the exemplary manufacturing process for forming a MEMS-drive. As shown in FIG. 4, fourth structure 400 may include handle layer 106, insulator layer 104, etched layer 202, first conformal insulator 302, and a first polysilicon layer 402.

In some embodiments, fourth structure 400 may be formed by depositing and processing first polysilicon layer 402 using CVD deposition techniques, like the ones described above. For example, polysilicon layer 402 may be deposited as a thick layer of polysilicon via APCVD. Additionally, or alternatively, first polysilicon layer 402 may be deposited in epitaxial batch reactors and the deposition rate may be selected so that first polysilicon layer 402 fills in trenches in etched layer 202 and covers etched layer 202 top surface.

In some embodiments, the formation of first polysilicon layer 402 may include an annealing process. For example, after it is deposited, first polysilicon layer 402 may be annealed at a temperature between 700° C.-900° C. to stabilize the layer. Additionally, or alternatively, after deposition, the first polysilicon layer 402 may be recrystallized by higher temperature anneals at between 950° C. and 1200° C.

In some embodiments, first polysilicon layer 402 may be deposited to a thickness that is greater than trench depth 212. For example, as shown in FIG. 4 first polysilicon layer 402 may be grown or deposited so that it extends above the top of the etched layer 202 and can then be polished to achieve a top thickness 404 of first polysilicon layer 402. Top thickness 404 may be selected to be between 0.05 um to 100 um. For example, in some embodiments top thickness 404 may be about 5 um (e.g., 5 um+/−1 um).

Figure 5:
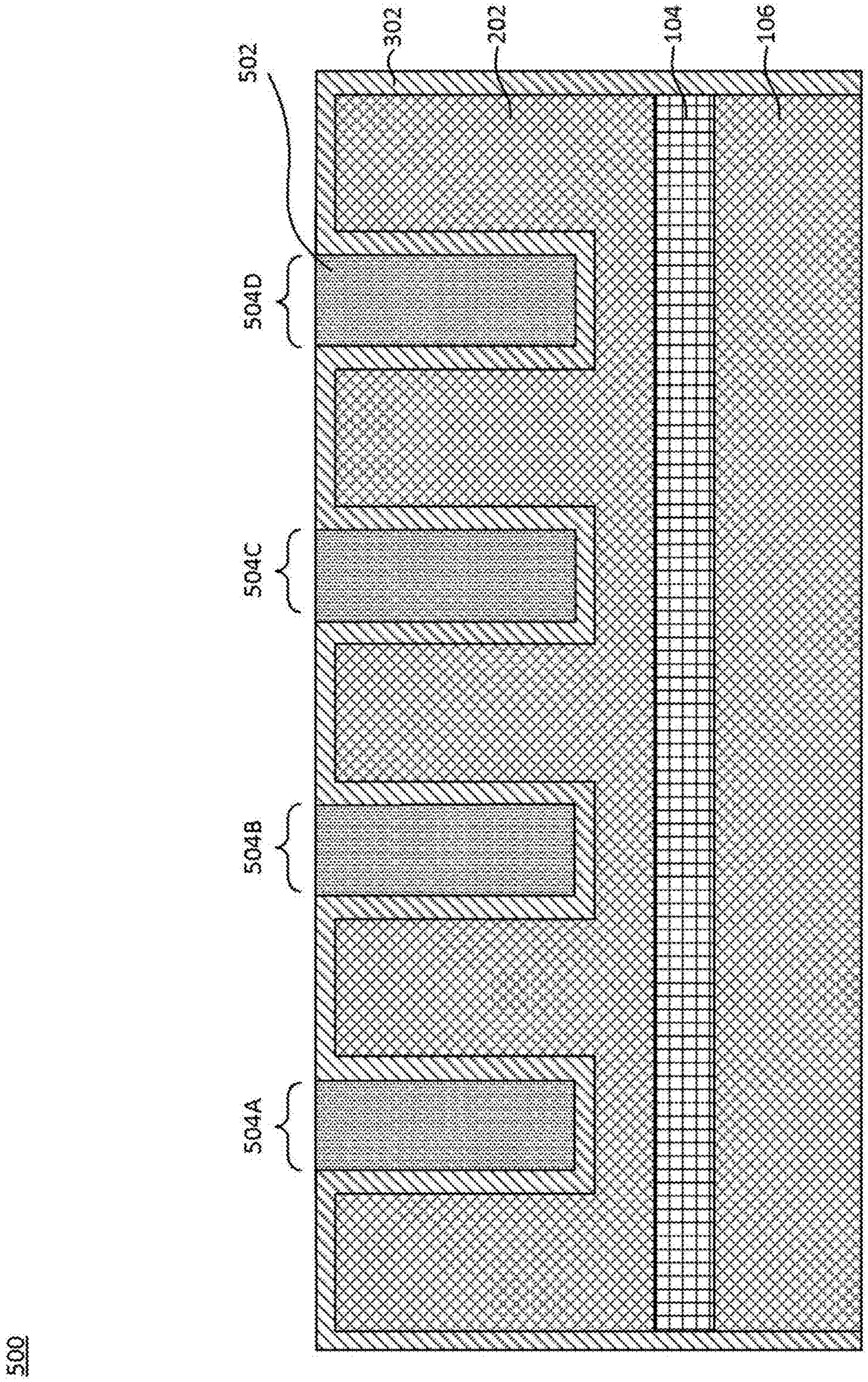
FIG. 5 shows a cross-sectional view of a fifth structure formed during the exemplary manufacturing process for forming a MEMS-drive.

FIG. 5 shows a cross-sectional view of a fifth structure 500 formed during the exemplary manufacturing process for forming a MEMS-drive. As shown in FIG. 5, fifth structure 500 may include handle layer 106, insulator layer 104, etched layer 202, first conformal insulator 302, and a patterned polysilicon layer 502.

In some embodiments, fifth structure 500 may be formed by polishing fourth structure 400 so that a portion of first polysilicon layer 402 is removed to be coplanar with a top of etched layer 202 (including first conformal insulator 302). For example, a polishing process such as chemical mechanical polishing (CMP) or planarization for smoothing surfaces with a combination of chemical and mechanical forces may follow the deposition of first polysilicon layer 402 to form patterned polysilicon layer 502. In such embodiments, the polishing or etch back of polysilicon may be performed in different stages. For example: first polysilicon layer 402 may be initially etched back using a field or blanket etching using wet or dry etching techniques; and then first polysilicon layer 402 may be polished with CMP processes. In some embodiments, half of top thickness 404 may be etched using blank etching and the second half of top thickness 404 may be etched through CMP to substantially have a uniform top surface having the top of etched layer 202 (including first conformal insulator 302) and patterned polysilicon layer 502.

As shown in FIG. 5, the process of polishing or etching back first polysilicon layer 402 may result in a series of polysilicon pedestals 504A-504D in fifth structure 500, also referred to herein as polysilicon pedestals 504. In some embodiments, polysilicon pedestals 504 may be uniform, having the same dimensions and materials. In other embodiments, however, polysilicon pedestals 504A-504D may have differences. For example, polysilicon pedestals 504A and 504C may have different materials or dimensions compared to pedestals 504B and 504D. In such embodiments, some pedestals may be wider, taller, and/or have a different material composition.

Figure 6:
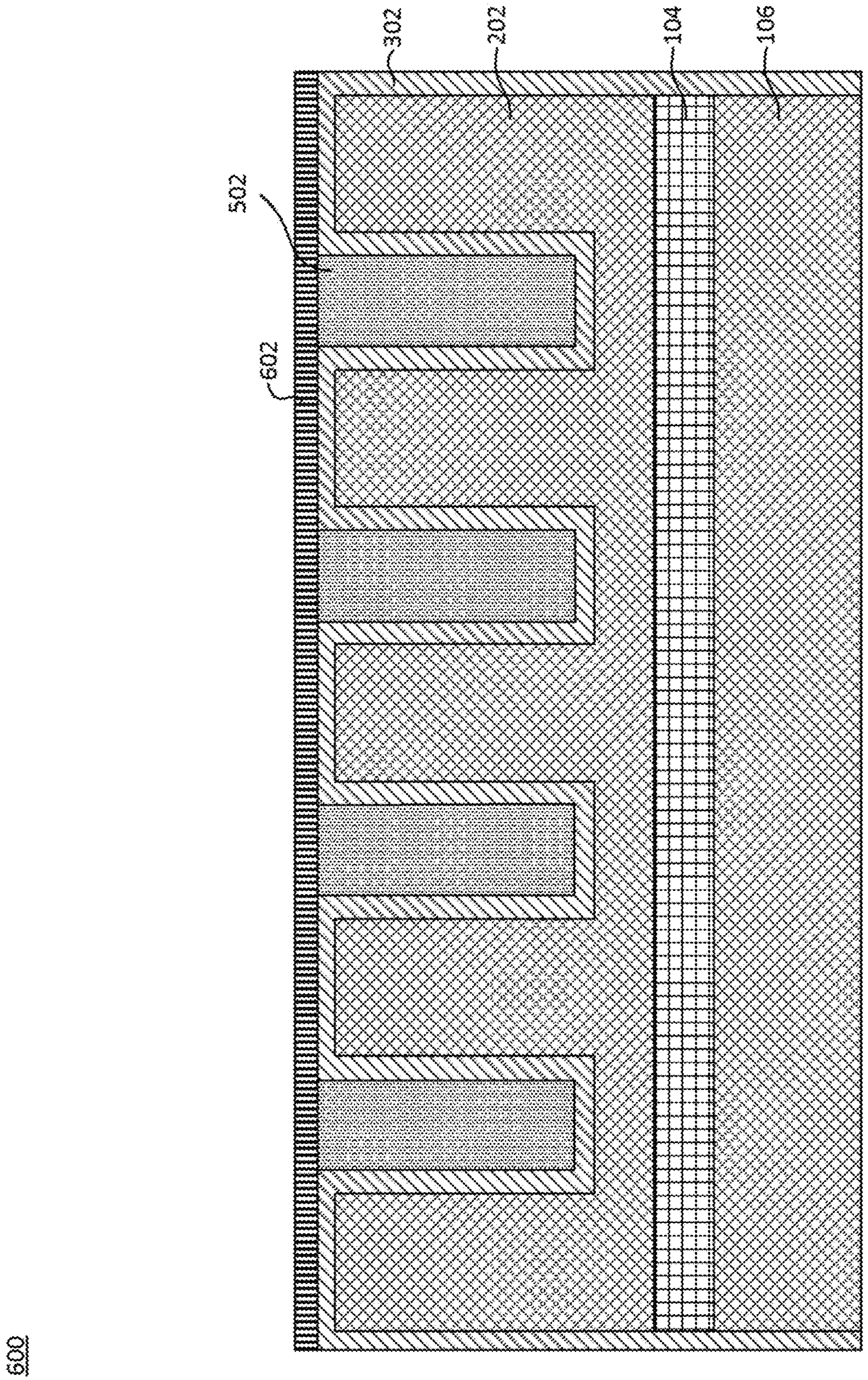
FIG. 6 shows a cross-sectional view of a sixth structure formed during the exemplary manufacturing process for forming a MEMS-drive.

FIG. 6 shows a cross-sectional view of a sixth structure 600 formed during the exemplary manufacturing process for forming a MEMS-drive. As shown in FIG. 6, sixth structure 600 may include handle layer 106, insulator layer 104, etched layer 202, first conformal insulator 302, patterned polysilicon layer 502 (including the polysilicon pedestals 504), and a first photoresist layer 602.

In some embodiments, sixth structure 600 may be formed from fifth structure 500 by depositing a photoresist layer. For example, sixth structure 600 may be formed by spin coating and baking a photoresist layer on fifth structure 500. In some embodiments, photoresist layer 602 may be applied on the top surface of fifth structure 500 and a soft-bake may be performed to reduce remaining solvent. Photoresist layer 602 may be formed to have a thickness between 0.05 and 1 um.

Figure 7:
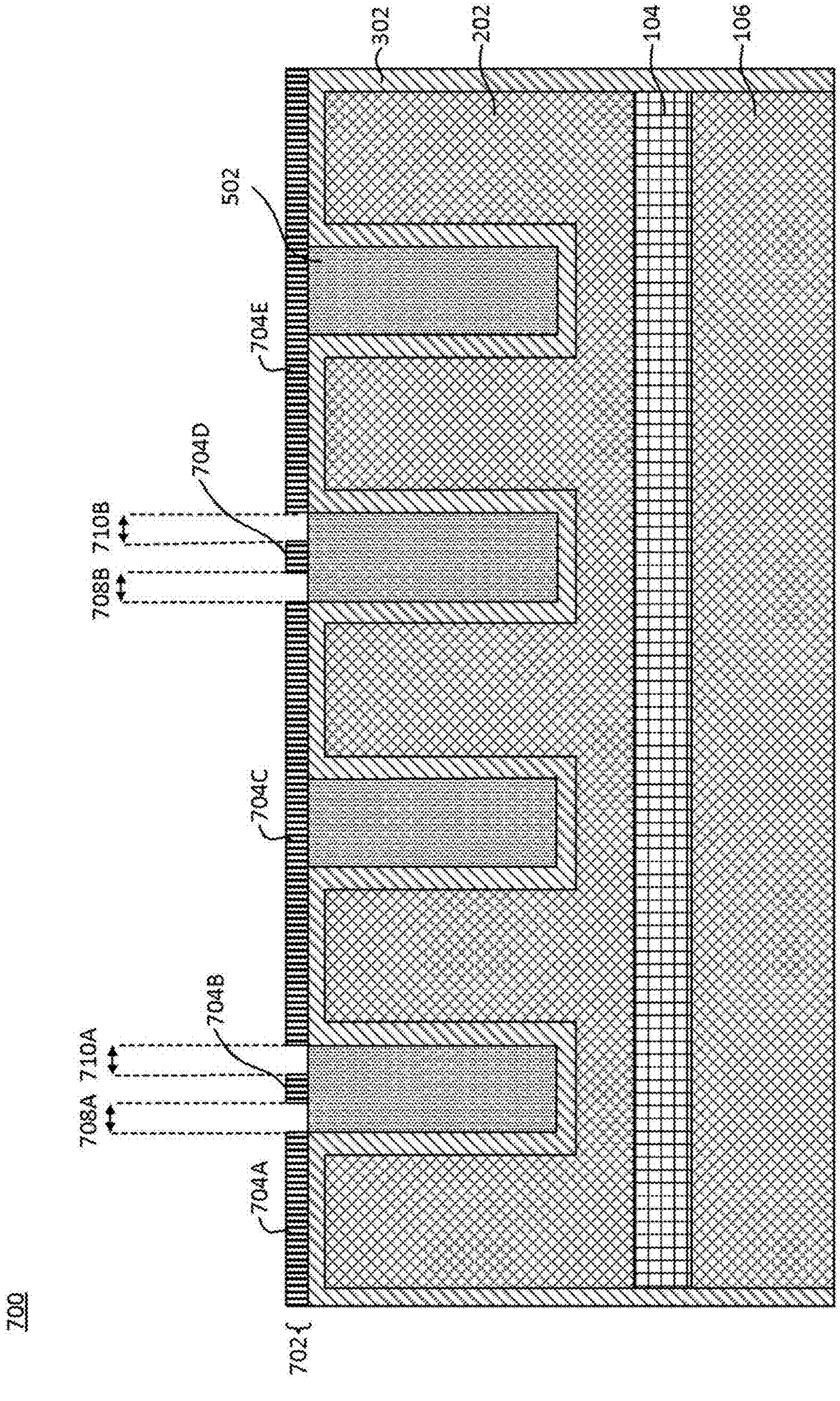
FIG. 7 shows a cross-sectional view of a seventh structure formed during the exemplary manufacturing process for forming a MEMS-drive.

FIG. 7 shows a cross-sectional view of a seventh structure 700 formed during the exemplary manufacturing process for forming a MEMS-drive. As shown in FIG. 7, seventh structure 700 may include handle layer 106, insulator layer 104, etched layer 202, first conformal insulator 302, patterned polysilicon layer 502 (including the polysilicon pedestals 504), and a patterned photoresist layer 702, including photoresist sections 704A-704E.

In some embodiments, seventh structure 700 may be formed from sixth structure 600 by performing a photolithography process to define photoresist sections 704A-704E. As described in FIG. 7, in some embodiments first photoresist layer 602 may be patterned so that only some portions of polysilicon pedestals 504 are exposed. As shown in the FIG. 7, patterned photoresist layer 702 may leave exposed portions of one or more of polysilicon pedestals 504 to permit partial etching of polysilicon pedestals 504 so that protrusions may be formed, as further discussed below.

Photoresist sections 704A-704E may have different patterns, sizes, and/or thicknesses. For example, as shown in FIG. 7, photoresist section 704A may have a different width than photoresist section 704B, which would define the pattern imprinted in one or more of polysilicon pedestals 504. Additionally, some of the photoresist sections, such as photoresist sections 704C and 704E, may completely cover or protect one or more polysilicon pedestals 504.

In some embodiments, photoresist sections 704A-704E may be formed so that they have a specific exposure area on polysilicon pedestals 504. For example, patterned photoresist layer 702 may be formed to have first exposure areas 708A-708B and second exposure areas 710A-710B. In some embodiments, first exposure areas 708A and 708B may have a similar width as second exposure areas 710A and 710B. In such embodiments, photoresist sections 704B-704E may create first exposure areas 708A and 708B and second exposure areas 710A and 710B that are symmetrical with respect to a vertical axis of polysilicon pedestal 504. In other embodiments, however, first exposure areas 708A and 708B may have a different width as second exposure areas 710A and 710B, resulting in asymmetric structures. The width of first exposure areas 708A and 708B and second exposure areas 710A and 710B may range between 0.05 and 10 um in certain embodiments. For example, the width of first exposure areas 708A and 708B may be of about 1 um (e.g., 1 um+/−0.5 um).

Figure 8:
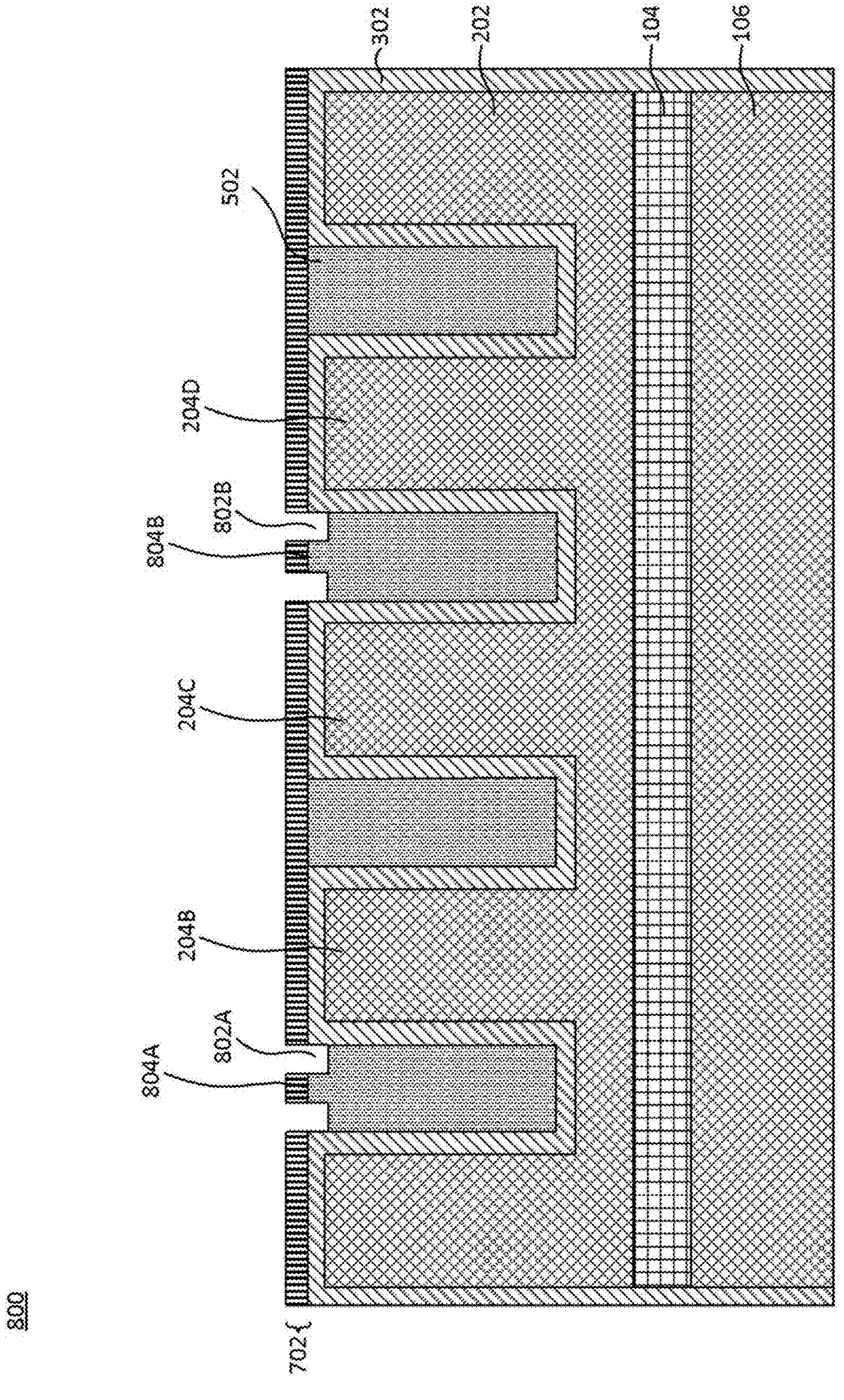
FIG. 8 shows a cross-sectional view of an eighth structure formed during the exemplary manufacturing process for forming a MEMS-drive.

FIG. 8 shows a cross-sectional view of an eighth structure 800 formed during the exemplary manufacturing process for forming a MEMS-drive. As shown in FIG. 8, eighth structure 800 may include handle layer 106, insulator layer 104, etched layer 202, first conformal insulator 302, patterned polysilicon layer 502 (including polysilicon pedestals 504), and patterned photoresist layer 702 (including photoresist sections 704A-704E). Additionally, as shown in FIG. 8, in eighth structure 800 polysilicon pedestals 504 have been partially etched to form recess regions 802A-802B, and protrusions 804A-804B.

In some embodiments, eighth structure 800 may be formed by etching regions of polysilicon pedestals 504 that are not covered by patterned photoresist 702 (i.e., the exposed regions). For example, exposed regions of polysilicon pedestals 504 may be partially etched using any type of dry or wet etching process to create recess regions 802A-802B. As only portions of polysilicon pedestals 504 are exposed, the etching process results in recess regions 802A-802B and protrusions 804A-804B, collectively referred to herein as protrusions 804. The etching process may be anisotropic in some embodiments (e.g., in a direction to create perpendicular walls). In other embodiments, however, the etching process may be isotropic and generate different profiles. Moreover, FIG. 8 also shows that the protrusions 804 may be formed to be symmetric with respect to a vertical axis of respective polysilicon pedestals 504.

In some embodiments, the partial etch to form protrusions 804 may etch 0.05 to 5 um from the top of exposed polysilicon pedestals 504. For example, about 1.5 um (e.g., 1.5 um+/−0.5 um) of the top of exposed polysilicon pedestal 504 may be etched, forming a protrusion that has a height of about 1.5 um. This is only an exemplary embodiment and alternative etching procedures, that target different applications, may have different dimensions.

Figure 9:
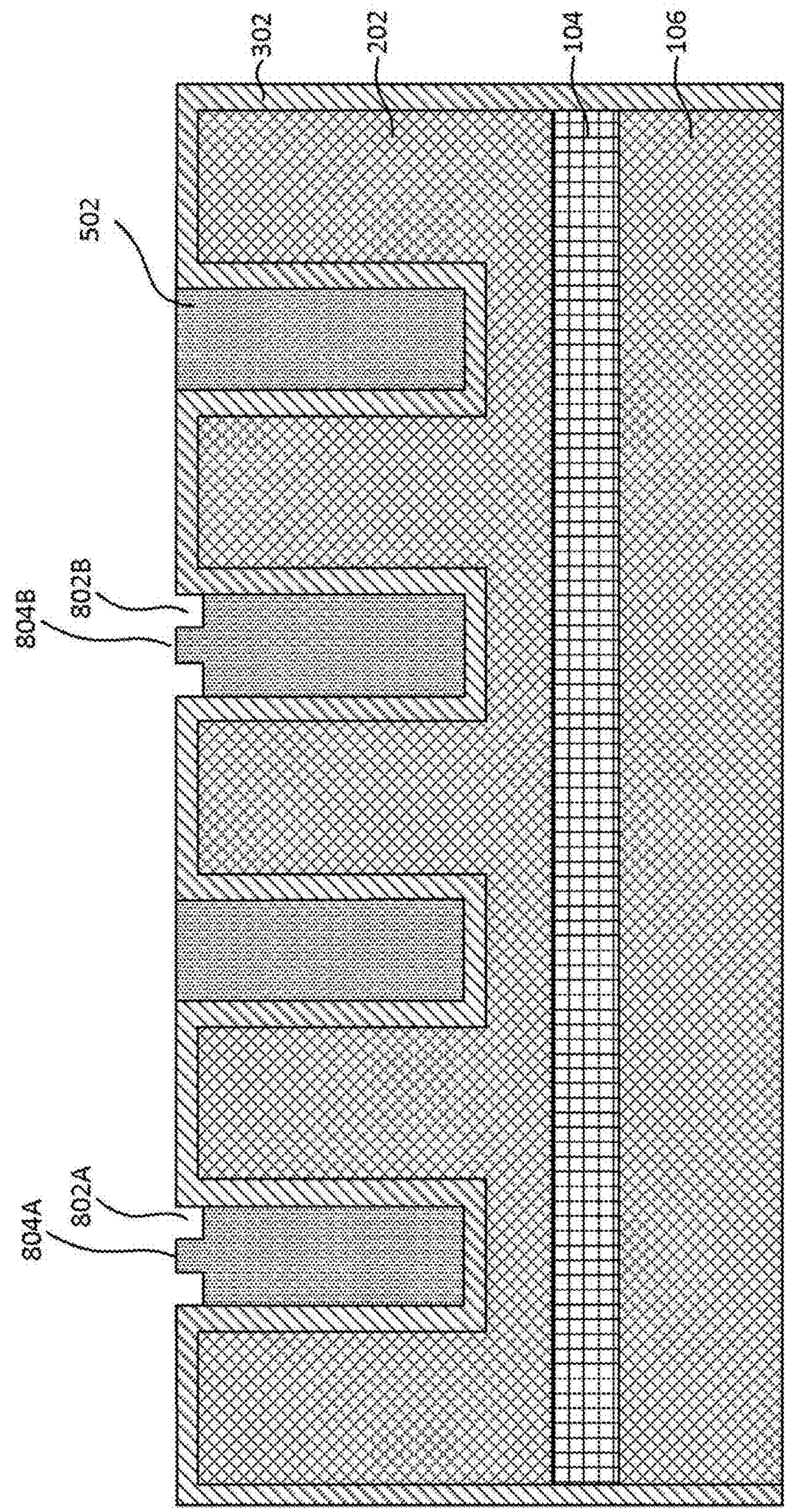
FIG. 9 shows a cross-sectional view of a ninth structure formed during the exemplary manufacturing process for forming a MEMS-drive.

FIG. 9 shows a cross-sectional view of a ninth structure 900 formed during the exemplary manufacturing process for forming a MEMS-drive. As shown in FIG. 9, ninth structure 900 may include handle layer 106, insulator layer 104, etched layer 202, first conformal insulator 302, patterned polysilicon layer 502 (including the polysilicon pedestals 504 that have been partially etched to form protrusions 804).

In some embodiments, ninth structure 900 may be formed by removing remaining photoresist material. For example, after partially etching the polysilicon pedestals 504, patterned photoresist layer 702 may be stripped. In some embodiments, patterned photoresist layer 702 may be stripped using organic solvents. In other embodiments, patterned photoresist layer 702 may be stripped through dry or blank etching to remove residual photoresist.

Figure 10:
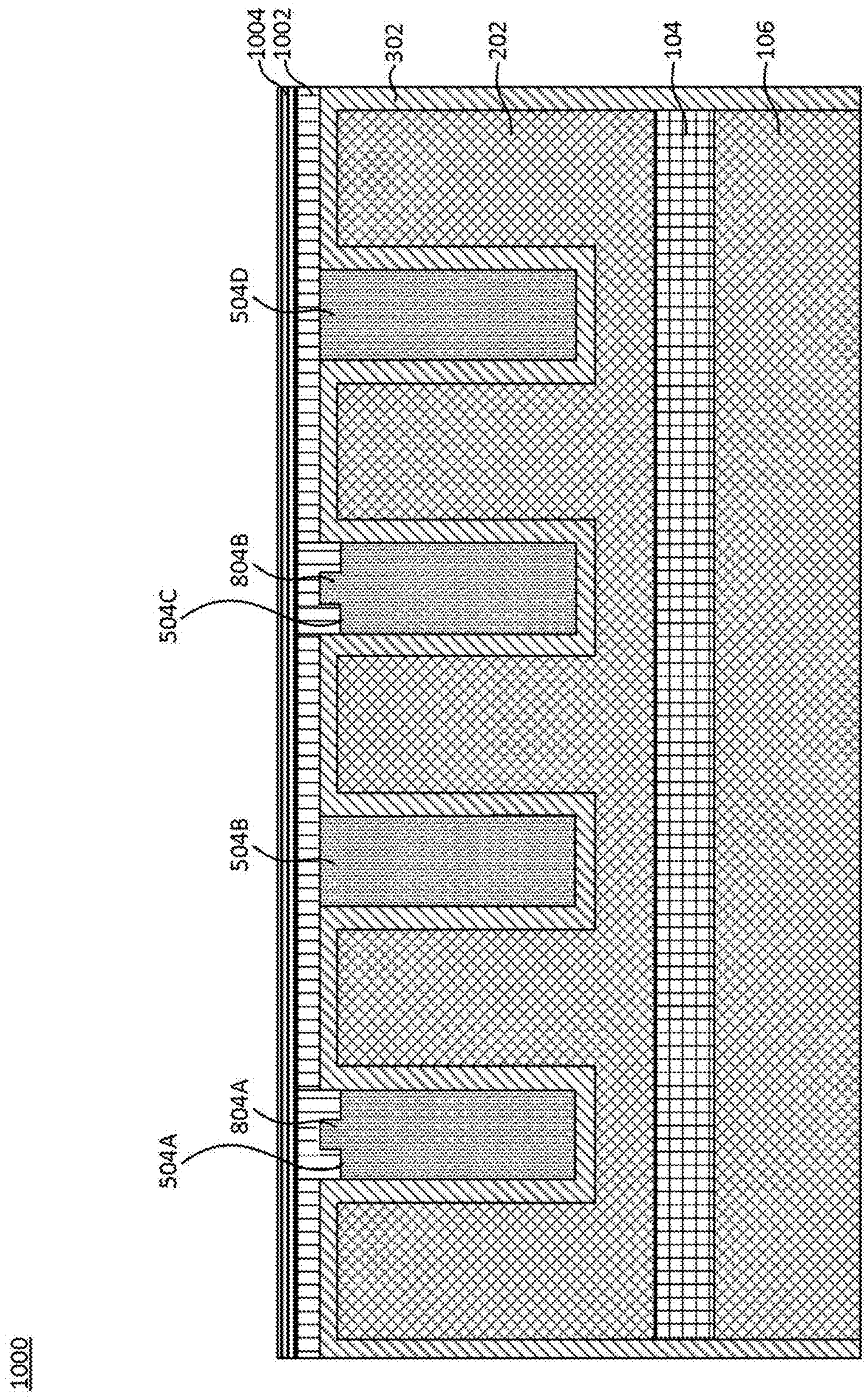
FIG. 10 shows a cross-sectional view of a tenth structure formed during the exemplary manufacturing process for forming a MEMS-drive.

FIG. 10 shows a cross-sectional view of a tenth structure 1000 formed during the exemplary manufacturing process for forming a MEMS-drive. As shown in FIG. 10, tenth structure 1000 may include handle layer 106, insulator layer 104, etched layer 202, first conformal insulator 302, patterned polysilicon layer 502 (including the polysilicon pedestals 504 that have been partially etched to form protrusions 804), a second polysilicon layer 1002, and a third polysilicon layer 1004.

In some embodiments, tenth structure 1000 may be formed by depositing second polysilicon layer 1002 and third polysilicon layer 1004 on ninth structure 900. For example, as discussed in connection with FIG. 4, polysilicon layers may be deposited using a variety of methods to grow polysilicon layers with etch rates and growth profiles that fill in trenches or gaps present in the material. For example, polysilicon layers may be grown through epitaxial growth and/or CVD processes.

As shown in FIG. 10, tenth structure 1000 may include two polysilicon layers. Second polysilicon layer 1002 may be deposited conformally, filling gaps of recess regions 802A-802B and creating a top layer above the etched layer 202. Second polysilicon layer 1002 may be deposited having a selected crystalline structure, selected doping, selected conductivity, and/or different material composition) Third polysilicon layer 1004 may be deposited over second polysilicon layer 1002 and be formed with a different material (e.g., polysilicon with a different composition, doping, and/or conductivity). In some embodiments, however, third polysilicon layer 1004 may have the same materials as second polysilicon layer 1002.

The deposition of second polysilicon layer 1002 may be similar to the deposition of first polysilicon layer 402, including deposition, anneal, and polishing or etch-back. In some embodiments, the deposited second polysilicon layer 1002 may have a thickness between 0.05 um and 10 um. For example, in certain embodiments second polysilicon layer 1002 may be formed to have a thickness of about 0.4 um (e.g., 0.4 um+/−0.2 um). In some embodiments, second polysilicon layer 1002 may be thicker than third polysilicon layer 1004. In some embodiments, second polysilicon layer 1002 may be formed using a selected etch rate and to have a specific material composition, a specific crystalline structure, and/or a specific conductivity or doping. In such embodiments, the composition of second polysilicon layer 1002 may be selected based on desired etch rates and/or conductivity in the MEMS drive.

The deposition of third polysilicon layer 1004 may also include epitaxial growth and/or a CVD process. But, unlike second polysilicon layer 1002, the deposition of third polysilicon layer 1004 may be for a layer with different material characteristics and/or with a different thickness. For example, third polysilicon layer 1004 may be formed to be 1 um or thicker and to have different doping. Additionally, or alternatively, third polysilicon layer 1004 may be formed at a different deposition rate and have a different quality and/or annealing process.

While FIG. 10 shows embodiments in which polysilicon layers are being deposited as two layers (second polysilicon layer 1002 and third polysilicon layer 1004), in some embodiments these two layers may be combined as a single layer. That is, instead of dividing the deposition of polysilicon into two layers, the polysilicon deposition may be combined, depositing a thicker polysilicon layer at one time.

Figure 11:
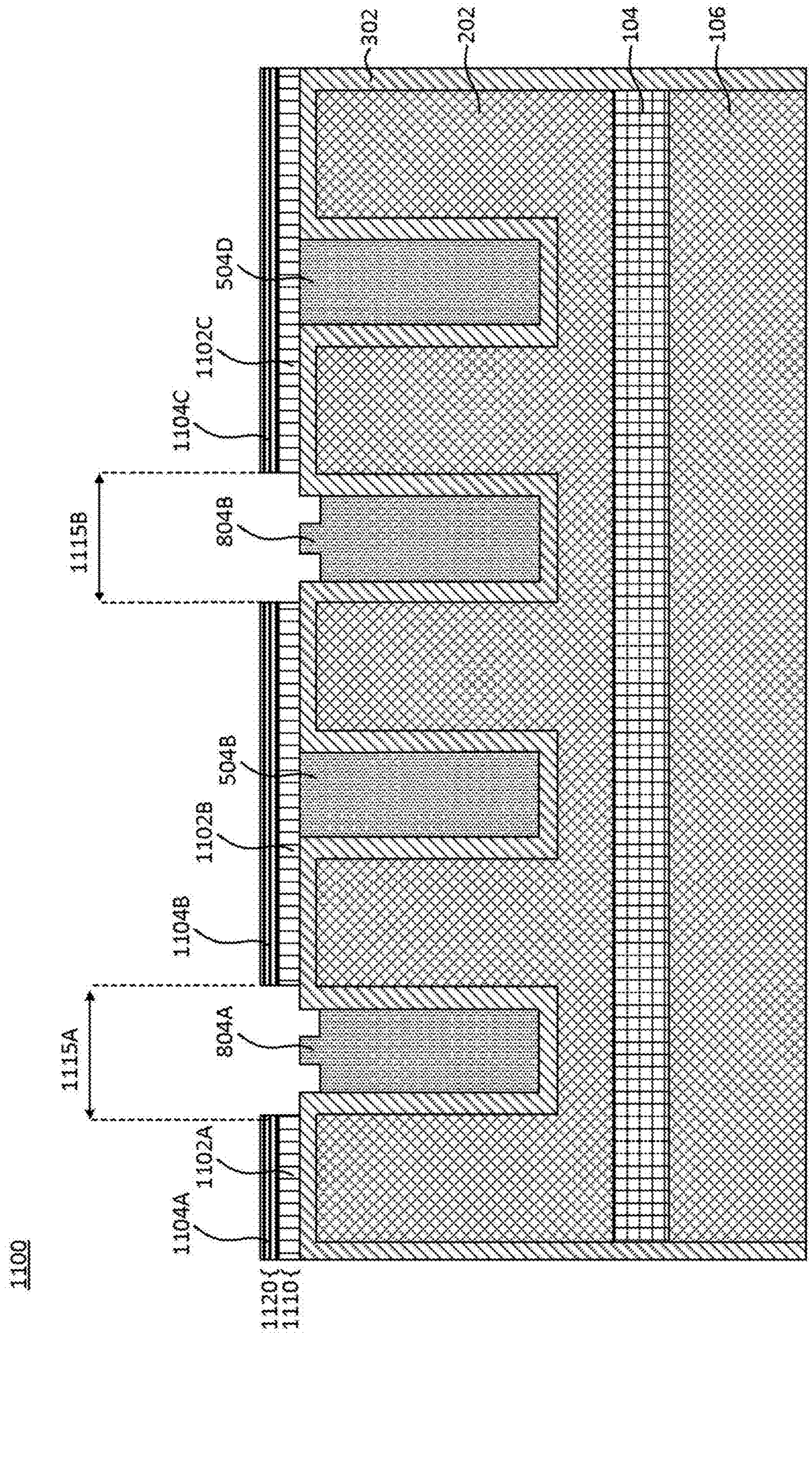
FIG. 11 shows a cross-sectional view of an eleventh structure formed during the exemplary manufacturing process for forming a MEMS-drive.

FIG. 11 shows a cross-sectional view of an eleventh structure 1100 formed during the exemplary manufacturing process for forming a MEMS-drive. As shown in FIG. 11, eleventh structure 1100 may include handle layer 106, insulator layer 104, etched layer 202, first conformal insulator 302, patterned polysilicon layer 502 (including the polysilicon pedestals 504 that have been partially etched to form protrusions 804), a first patterned polysilicon 1110, and a second patterned polysilicon 1120.

In some embodiments, eleventh structure 1100 may be formed by selectively etching second polysilicon layer 1002 and third polysilicon layer 1004 to form first patterned polysilicon 1110 and a second patterned polysilicon 1120, respectively. Similar to the process described in connection with FIG. 8, etching of second polysilicon layer 1002 and third polysilicon layer 1004 may be performed by performing photolithography and anisotropic selective etching to remove specific regions of the polysilicon layers. For example, a photoresist layer may be patterned on third polysilicon layer 1004 so that it covers the entire layer with the exception of etch windows 1115A-1115B. After patterning the photoresist, a dry etch process may be employed to form first patterned polysilicon 1110 and second patterned polysilicon 1120. The dry etch process may etch first patterned polysilicon 1110 and second patterned polysilicon 1120 exposing polysilicon pedestals 504 with protrusions 804 Additionally, or alternatively, the formation of first patterned polysilicon 1110 and second patterned polysilicon 1120 may involve scarification of the polysilicon layers and anneals (e.g., annealing the layers at temperatures between 500-1500° C. for 0.5-5 hours).

The size of etch windows 1115A-1115B in second polysilicon layer 1002 and third polysilicon layer 1004 may be proportional to the width of the polysilicon pedestals 504. For example, in some embodiments, the width of the etch windows 1115A-1115B may be 110% of the width of the polysilicon pedestals 504. In other embodiments, however, the size of etch windows 1115A-1115B may be predetermined at, for example, a width between 2-20 um.

Moreover, in some embodiments the size of etch windows 1115A-1115B is the same throughout the structure. In such embodiments, the size of etch window 1115A may be the same as the size of etch window 1115B. In other embodiments, however, the sizes of the windows may be different. For example, the size of etch window 1115A may larger than the size of etch window 1115B to permit different vibration arrangements in the MEMS comb structure or to permit alternative designs.

Figure 12:
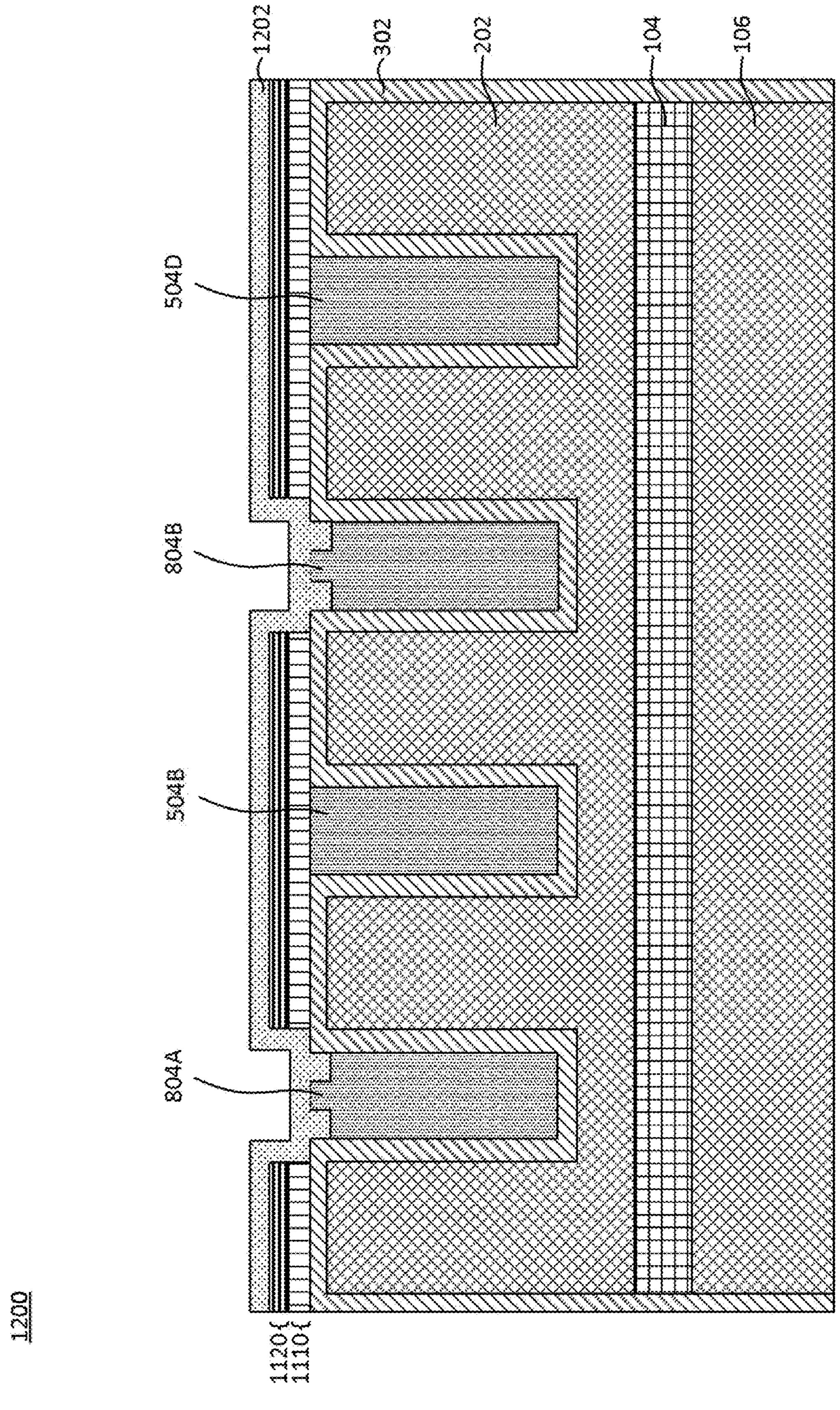
FIG. 12 shows a cross-sectional view of a twelfth structure formed during the exemplary manufacturing process for forming a MEMS-drive.

FIG. 12 shows a cross-sectional view of a twelfth structure 1200 formed during the exemplary manufacturing process for forming a MEMS-drive. As shown in FIG. 12, twelfth structure 1200 may include handle layer 106, insulator layer 104, etched layer 202, first conformal insulator 302, patterned polysilicon layer 502 (including the polysilicon pedestals 504 that have been partially etched to form protrusions 804), first patterned polysilicon 1110, second patterned polysilicon 1120, and a conformal conductive layer 1202.

In some embodiments, forming twelfth structure 1200 may involve a conformal deposition of a conductive material to form conformal conductive layer 1202. In some embodiments, the deposition of conformal conductive layer 1202 may be performed by sputtering or evaporation of a conductive layer. For example, in some embodiments AlCu may be sputtered on the entire surface of the structure to form conformal conductive layer 1202. Other methods may be employed to deposit conformal conductive layer 1202. For example, in some embodiments, filament evaporation may be employed to form conformal conductive layer 1202. In other embodiments, electron-beam evaporation, or flash evaporation, or induction evaporation, may be performed to form conformal conductive layer 1202. Conformal conductive layer 1202 may be formed with at least one of AlCu, TiN, TaN, AlSiCu, or Cu. Additionally, or alternatively, conformal conductive layer 1202 may be formed with alloys of metals.

The thickness of conformal conductive layer 1202 may be selected based on target mechanical and electrical properties for the devices being constructed. For example, devices requiring greater mobility may use thinner structures to enhance vibration, but devices prioritizing conductivity may use a thicker conformal conductive layer 1202. In some embodiments, conformal conductive layer 1202 may have a thickness of 0.5 um to 20 um. For example, conformal conductive layer 1202 may be about 1.5 um (e.g., 1.5 um+/−0.5 um).

Figure 13:
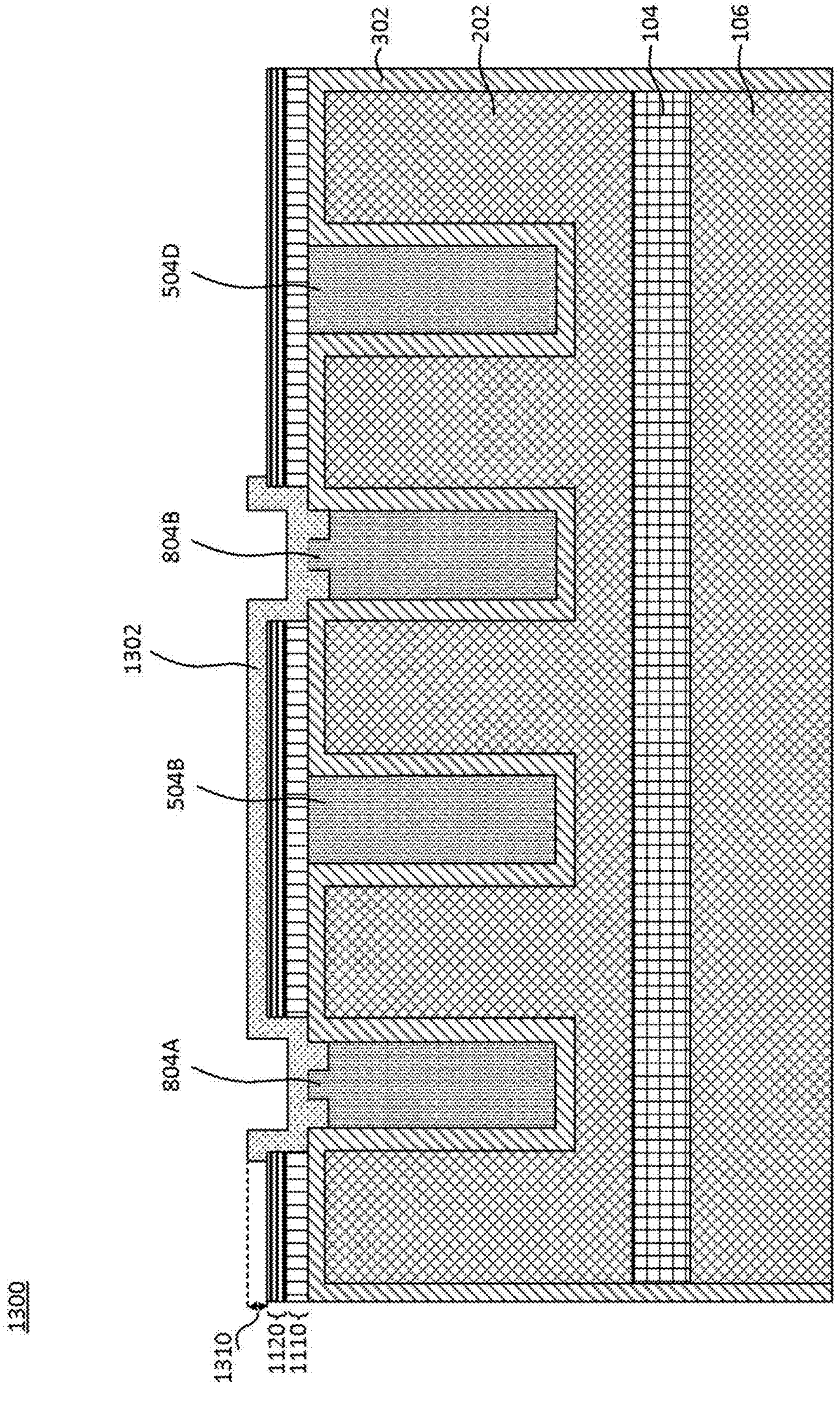
FIG. 13 shows a cross-sectional view of a thirteenth structure formed during the exemplary manufacturing process for forming a MEMS-drive.

FIG. 13 shows a cross-sectional view of a thirteenth structure 1300 formed during the exemplary manufacturing process for forming a MEMS-drive. As shown in FIG. 13, thirteenth structure 1300 may include handle layer 106, insulator layer 104, etched layer 202, first conformal insulator 302, patterned polysilicon layer 502 (including the polysilicon pedestals 504 that have been partially etched to form protrusions 804), first patterned polysilicon 1110, second patterned polysilicon 1120, and a comb electrode 1302.

In some embodiments, forming thirteenth structure 1300 may involve a photolithography and etching of conformal conductive layer 1202 to form comb electrode 1302. For example, after deposition and anneal of conformal conductive layer 1202 a photoresist layer may be patterned over conductive layer 1202 and defined via photolithography to cover regions of comb electrode 1302. In such embodiments, a comb electrode thickness 1310 may be defined based on the thickness of conductive layer 1202. For example, if conductive layer 1202 was deposited to a thickness of 1 um, comb electrode thickness 1310 would have similar, or the same, thickness. Then different etching processes may be employed to etch exposed regions to form comb electrode 1302. For example, selective chemical etching may be employed to remove exposed sections of conformal conductive layer 1202 without affecting underlying polysilicon, or silicon materials. Additionally, or alternatively, dry etching procedures directed to selectively etch conductors may be employed to form comb electrode 1302.

As shown in FIG. 13, the portion of unetched conformal conductive layer 1202 may include at least three polysilicon pedestals 504. In such embodiments comb electrode 1302 may form a bridge between two non-adjacent polysilicon pedestals 1302.

While FIG. 13 shows a single comb electrode 1302, multiple comb electrodes can be fabricated in parallel. For example, as further discussed below in connection with FIGS. 17 and 23, the same structure may be repeated multiple times to have multiple of comb electrodes 1302 arranged in parallel.

Figure 14:
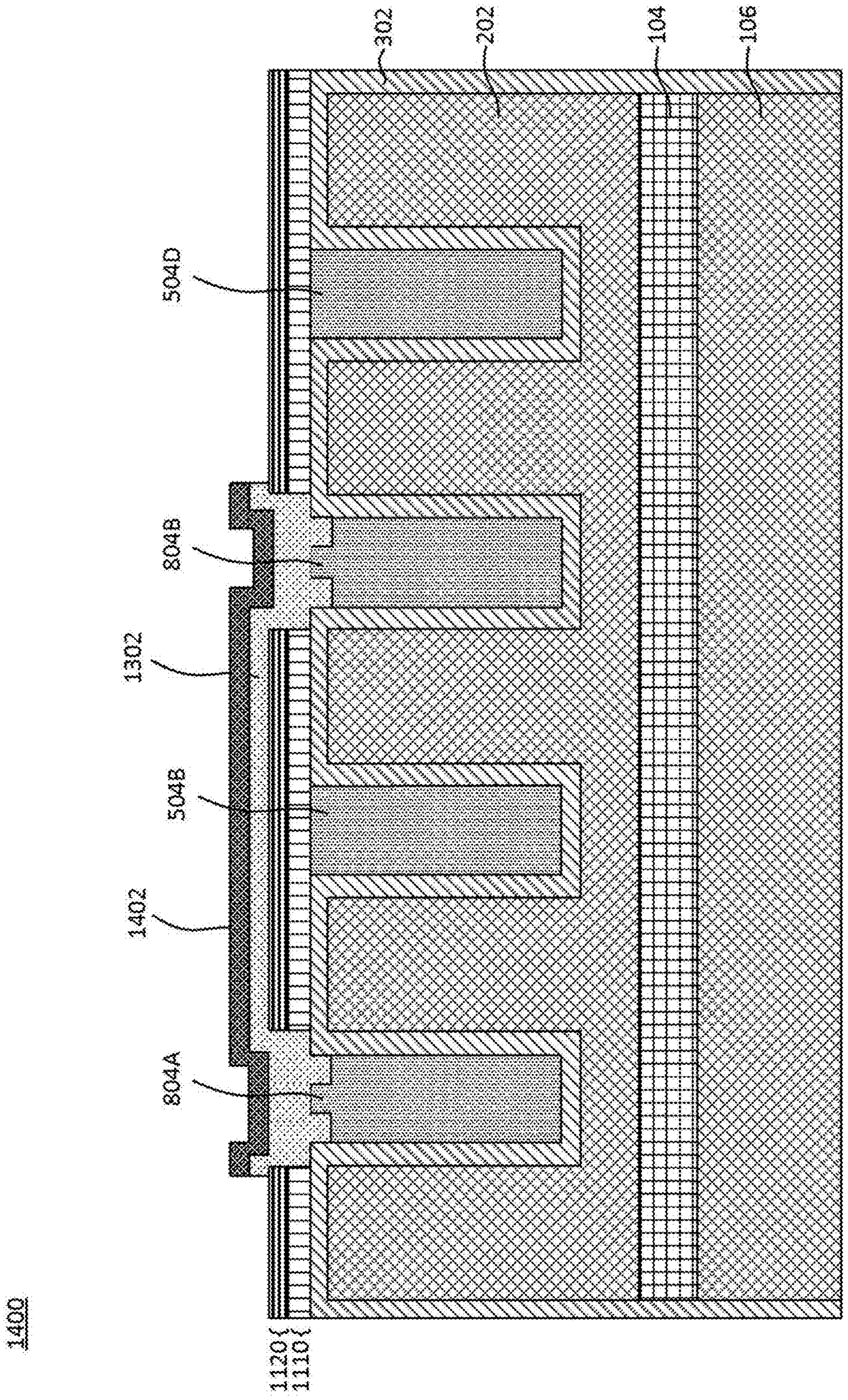
FIG. 14 shows a cross-sectional view of a fourteenth structure formed during the exemplary manufacturing process for forming a MEMS-drive.

FIG. 14 shows a cross-sectional view of a fourteenth structure 1400 formed during the exemplary manufacturing process for forming a MEMS-drive. As shown in FIG. 14, fourteenth structure 1400 may include handle layer 106, insulator layer 104, etched layer 202, first conformal insulator 302, patterned polysilicon layer 502 (including the polysilicon pedestals 504 that have been partially etched to form protrusions 804), first patterned polysilicon 1110, second patterned polysilicon 1120, comb electrode 1302, and protective layer 1402.

In some embodiments, forming fourteenth structure 1400 may involve depositing and patterning a protective layer over the comb electrode 1302. For example, a protective dielectric layer may be deposited using a CVD process. This dielectric layer may be patterned to form a protective layer that is then patterned through photolithography to form protective layer 1402.

In some embodiments protective layer 1402 may be a composite formed with multiple layers. For example, protective layer 1402 may include an oxide, an oxynitride, and a metal layer. In such embodiments, protective layer may be formed through a series of CVD depositions and/or evaporations to form the composite layer. In such embodiments, protective layer 1402 may include 0.05 um to 5 um of a passivation oxide, 0.03 to 3 um of silicon oxynitride, and 0.04 to 4 um of a metal alloy. Additionally, or alternatively, protective layer 1402 may include at least one of silicon oxide, silicon nitride, silicon carbide, fluorosilicate glass, undoped silicate glass, or borophosphosilicate glass.

In some embodiments, the thickness of protective layer 1402 may be selected as a function of the thickness of comb electrode 1302. For example, the thickness of protective layer 1402 may be between 100% and 1,000% of the thickness of the comb electrode 1302. In other embodiments, however, the thickness of protective layer 1402 may be a fraction of the thickness of comb electrode 1302. For instance, the thickness of protective layer 1402 may be $\frac{1}{8}^{th}$ to $\frac{2}{3}^{rd}$ of the thickness of comb electrode 1302. In some embodiments, the thickness of protective layer 1402 may be between 0.2 and 20 um. For example, the thickness of protective layer 1402 may be about 3 um (e.g., 3 um+/−1 um).

Figure 15:
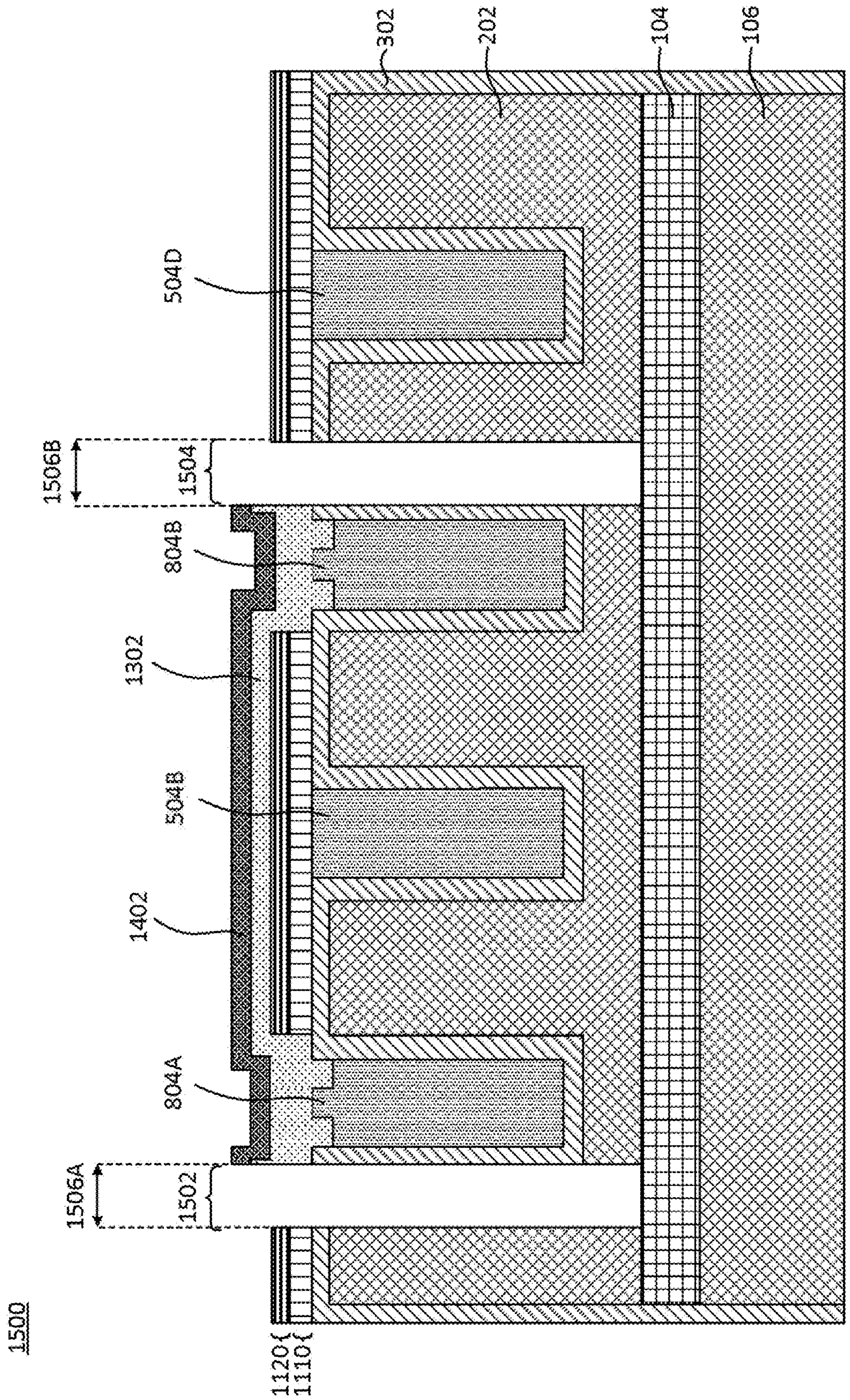
FIG. 15 shows a cross-sectional view of a fifteenth structure formed during the exemplary manufacturing process for forming a MEMS-drive.

FIG. 15 shows a cross-sectional view of a fifteenth structure 1500 formed during the exemplary manufacturing process for forming a MEMS-drive. As shown in FIG. 15, fifteenth structure 1500 may include handle layer 106, insulator layer 104, etched layer 202, first conformal insulator 302, patterned polysilicon layer 502 (including the polysilicon pedestals 504 that have been partially etched to form protrusions 804), first patterned polysilicon 1110, second patterned polysilicon 1120, comb electrode 1302, and protective layer 1402. In fifteenth structure 1500, however, conduits 1502 and 1504 have been formed in the structure in preparation for a silicon and polysilicon release.

In some embodiments, forming fifteenth structure 1500 may involve photolithography and deep etching of the structure using, for example, DRIE. For example, a hard mask may be formed on fourteenth structure 1400. This hard mask may expose regions that will be etched out through etched layer 202 to insulator layer 104 in preparation for a release etch. In other embodiments, however, the etching of conduits 1502 and 1504 may need not require a hard mask and can be performed simply with a photoresist layer. For example, a layer of photoresist between 0.5 um and 20 um may be used as protection during the DRIE process to etch conduits 1502 and 1504. Moreover, while conduits 1502 and 1504 may be formed using plasma-based etching procedures (like DRIE), other embodiments may employ alternative etching using, for example, mechanical etching and/or laser ablation.

In some embodiments, as shown in FIG. 15, conduits 1502 and 1504 may have similar dimensions. For example, conduits 1502 and 1504 may have the same width, area, profile, and depth. In such embodiments, apertures 1506A-1506B may be uniform throughout the structure. In other embodiments, however, conduits 1502 and 1504 may not be uniform and may have different shapes, profiles, or depths. In such embodiments apertures 1506A-1506B may be of different size or shape. For example, aperture 1506A may be smaller than aperture 1506B to manipulate etch rates and/or control etching.

As shown in FIG. 15, conduits 1502 and 1504 may completely etch through etched layer 202. In other embodiments, however, conduits 1502 and 1504 may only partially etch etched layer 202 (e.g., without reaching insulator layer 104). In yet other embodiments, conduits 1502 and 1504 may go through insulator layer 104. For example, in some embodiments conduits 1502 and 1504 may etch into handle layer 106.

Figure 16:
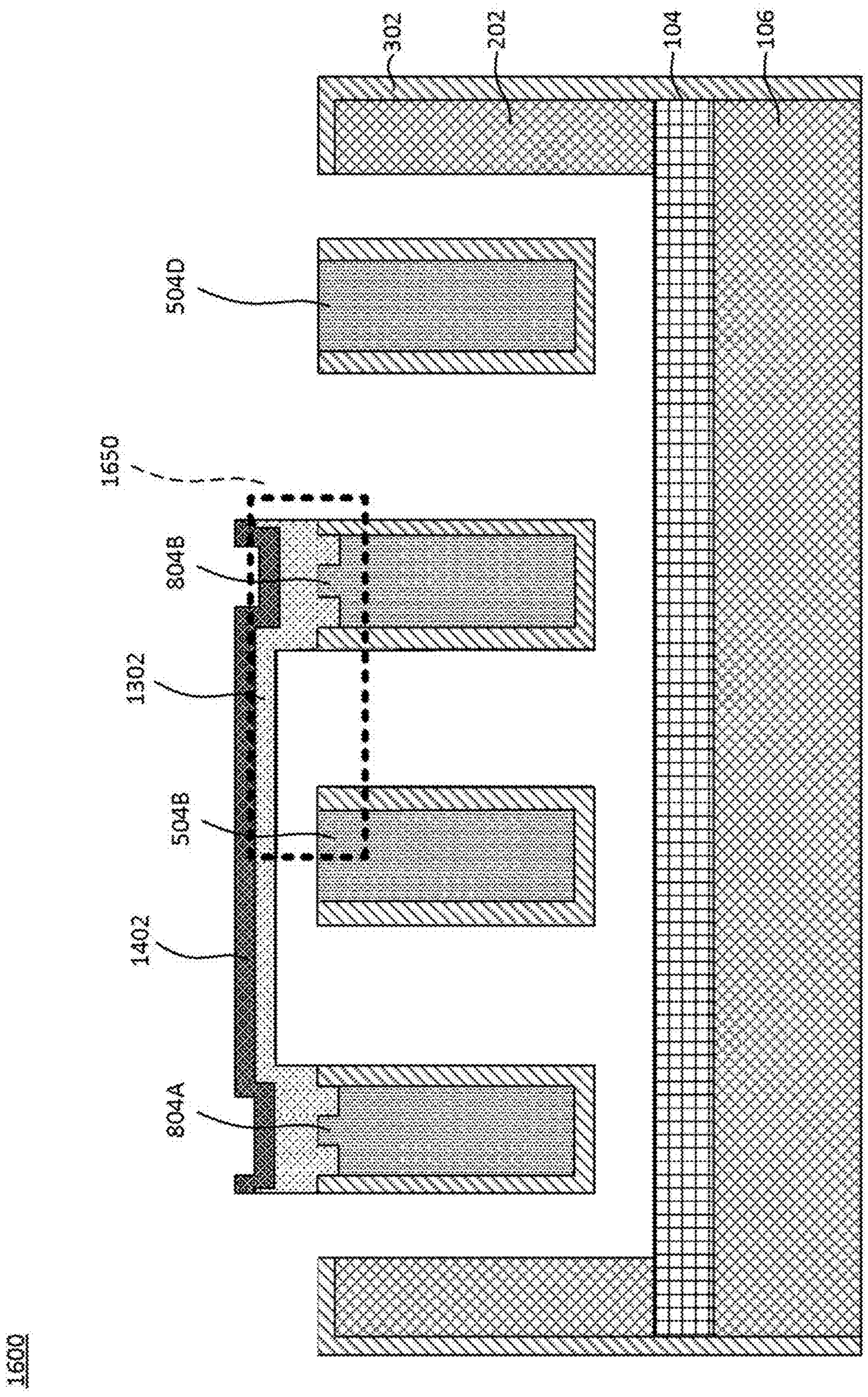
FIG. 16 shows a cross-sectional view of a sixteenth structure formed during the exemplary manufacturing process for forming a MEMS-drive.

FIG. 16 shows a cross-sectional view of a sixteenth structure 1600 formed during the exemplary manufacturing process for forming a MEMS-drive. As shown in FIG. 16, sixteenth structure 1600 may include handle layer 106, insulator layer 104, portions of etched layer 202, portions of first conformal insulator 302, comb electrode 1302, and protective layer 1402. In sixteenth structure 1600, previous layers have been etched to release comb electrode 1302 and enable its operation as part of the MEMS drive. For example, in sixteenth structure 1600 first patterned polysilicon 1110, second patterned polysilicon 1120, first conformal insulator 302, and etched layer 202 are removed (or partially removed) to release comb electrode 1302 and permit vibrations, movement, or actuation.

In some embodiments, sixteenth structure 1600 may be formed by etching layers using chemical etchants directed to removing polysilicon and silicon materials. For example, in some embodiments wet etchant may be flowed through conduits 1502 and 1504 to remove patterned polysilicon 1120, first conformal insulator 302, and etched layer 202 to cause the release of the structure. As shown in FIG. 16, comb electrode 1302 may bridge at least two polysilicon pedestals 504. And as further shown in FIG. 16, etching to remove patterned polysilicon 1120 may include fully etching unetched sections 204A-204E, fully removing intervening silicon layers. Additionally, or alternatively, comb electrode 1302 may be anchored to protrusions 804. As further discussed below, this arrangement of comb electrode 1302 may improve their performance by enhancing capacitive drive, increasing mobility and dynamic range, and improving vibration space for the MEMS drive.

Figure 20:
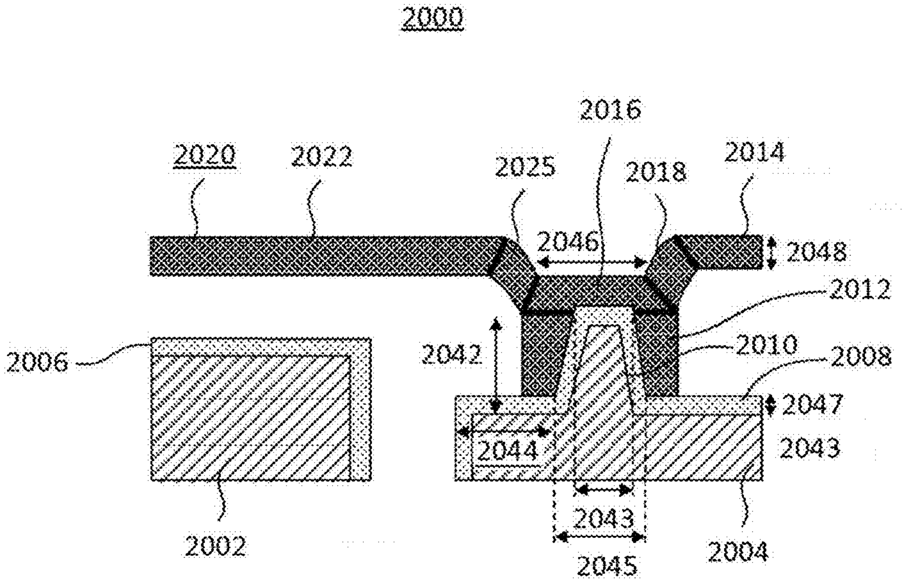
FIG. 20 shows a cross-sectional view of a second exemplary embodiment of a semiconductor device in accordance with embodiments of the present disclosure.
Figure 21:
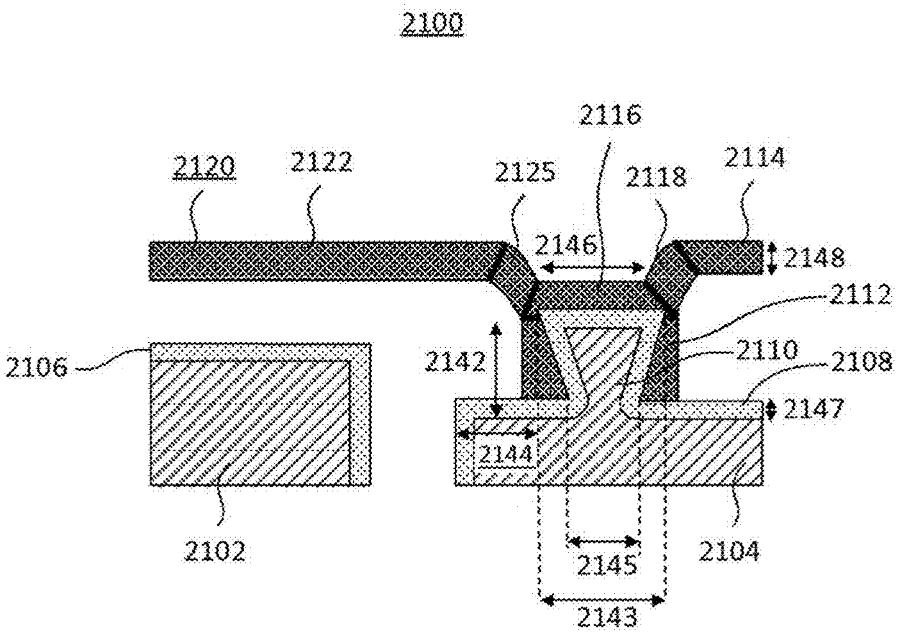
FIG. 21 shows a cross-sectional view of a third exemplary embodiment of a semiconductor device in accordance with embodiments of the present disclosure.
Figure 22:
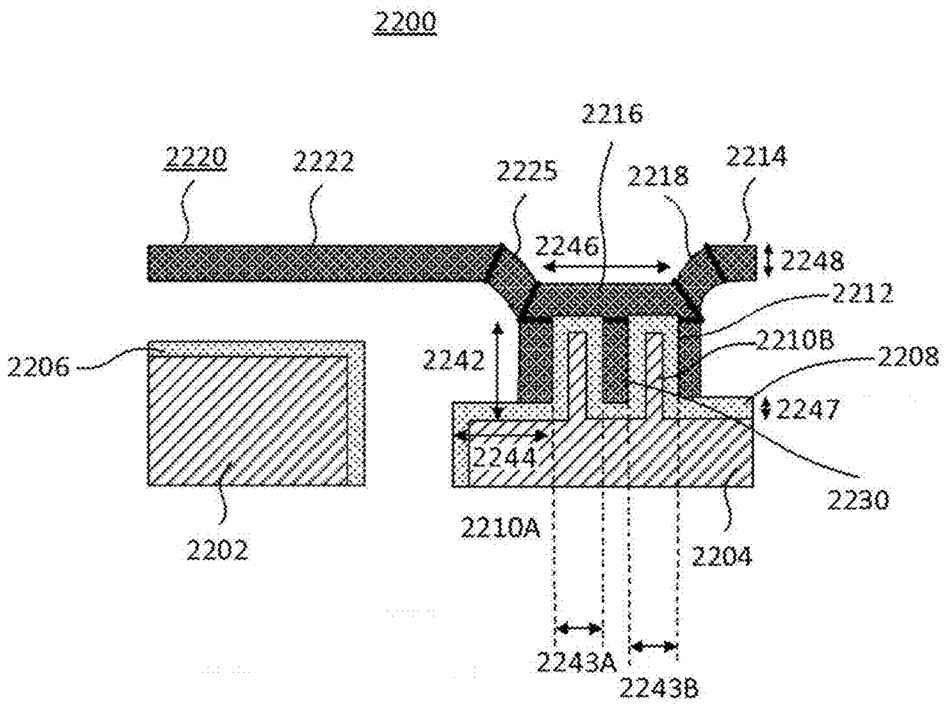
FIG. 22 shows a cross-sectional view of a fourth exemplary embodiment of a semiconductor device in accordance with embodiments of the present disclosure.

FIG. 16 shows a focus area 1650 that focuses on an area of sixteenth structure 1600 that includes protrusion 804B and a portion of polysilicon pedestal 504B without protrusion. As further discussed below, focus area 1650 may include certain modifications in different embodiments of sixteenth structure 1600. For example, protrusion 804B in focus area 1650 may have different shapes, sizes, or characteristics than the ones shown in FIG. 16. For example, as shown in FIGS. 20-22, protrusion 804B may have slanted walls and/or intervening trenches. Additionally, or alternatively, polysilicon pedestal 504B in focus area may have different widths, thicknesses, or material composition than the ones shown in FIG. 16 (see e.g., FIGS. 20-22).

Figure 17:
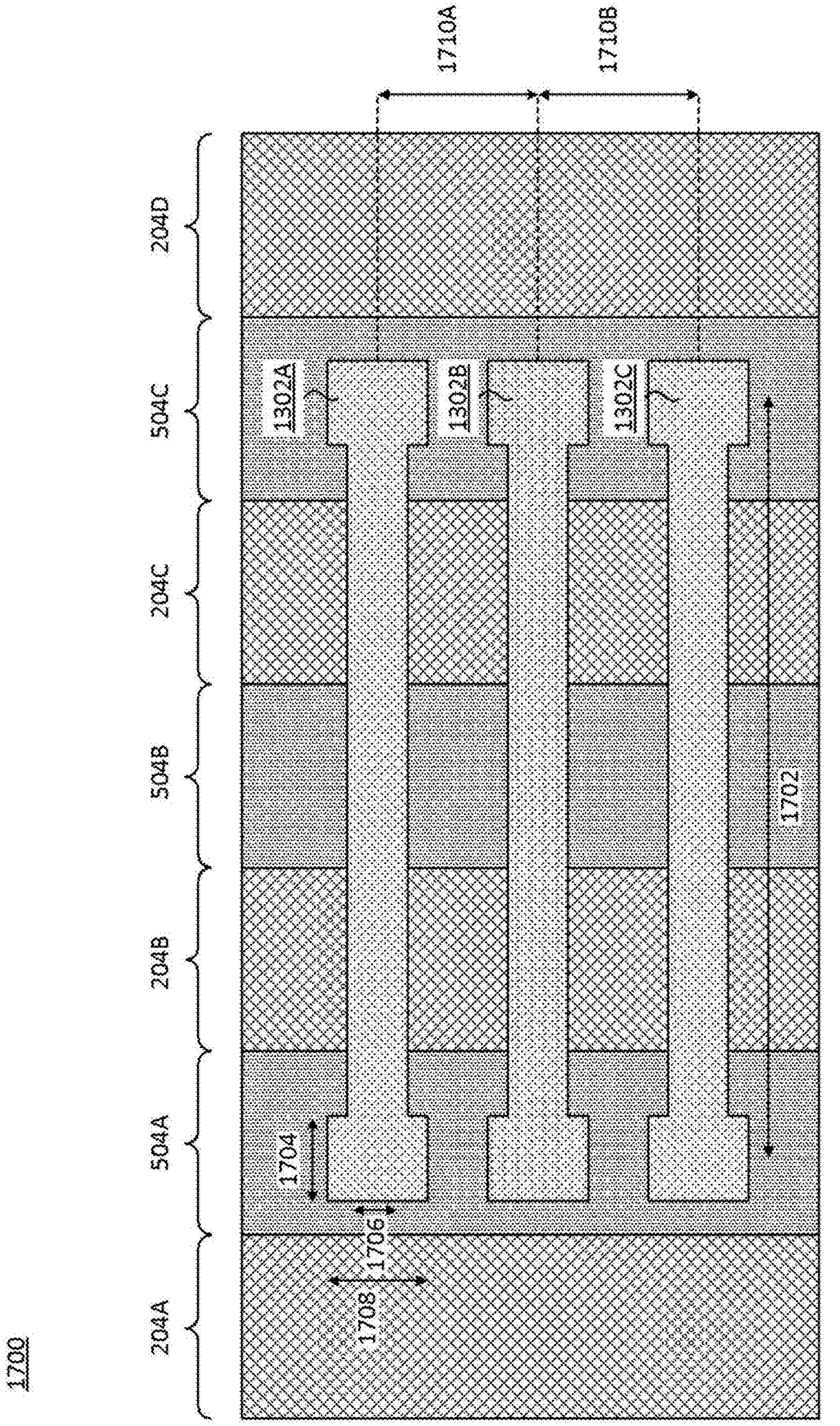
FIG. 17 shows a top view of a structure formed during the exemplary manufacturing process.

FIG. 17 shows a top view of a seventeenth structure 1700 formed during the exemplary manufacturing process. In some embodiments, seventeenth structure 1700 may be a top view of the thirteenth structure 1300 showing the structure before forming protective layer 1402. As shown in FIG. 17, seventeenth structure 1700 may include multiple comb electrodes 1302, mounted over polysilicon pedestals 504. FIG. 17 also shows unetched sections 204A-204D and shows comb electrodes 1302 having a comb length 1702, comb width 1706, contact width 1708, and contact length 1704.

FIG. 17 shows multiple comb electrodes 1302 arranged in parallel, oriented substantially perpendicular across polysilicon pedestals 504, to create the MEMS drive. Such parallel arrangement may be beneficial for determining capacitance, vibration, and/or other type of actuation or sensing. In some embodiments, however, comb electrodes may have different arrangements based on specific applications. For example, comb electrodes 1302 may be arranged diagonally with respect to polysilicon pedestals 504. Additionally, or alternatively, comb electrodes 1302 may not be arranged in parallel, having for example different distances therebetween at different points. Such different distances may be designed based on different applications.

FIG. 17 shows the contacts being rectangular, having dimensions of contact width 1708 and contact length 1704. However, in other embodiments the contact may have different shapes or dimensions. For example, in some embodiments the contact may have a circular shape, with protrusions 804 being at the center of the circle. In other embodiments, the contacts may have polygonal shapes, forming for example hexagons or octagons. In such embodiments, the shape of the contact may be selected based on area, friction, and/or stability considerations.

In some embodiments, length 1702 may be between 0.05 um and 50 um. For example, length 1702 may be of about 25 um (e.g., 25 um+/−5 um). Additionally, or alternatively, in some embodiments length 1702 may be a proportion of width 1706. For example, length 1702 may be designed to be 10 times width 1706. Such ratio may be selected according to estimated mechanical stress and/or based on predicted movement or vibration of selected applications. Additionally, or alternatively, length 1702 may be selected according to comb electrode thickness 1310, as defined by conductive layer 1202 (see FIG. 12). For example, length 1702 may be selected to be 10-50 times the thickness of comb electrode 1302.

In some embodiments, width 1706 may be between 0.01 um and 10 um. For example, width 1706 may be of about 5 um (e.g., 5 um+/−1 um). Additionally, or alternatively, in some embodiments width 1706 may be a proportion of length 1702. For example, width 1706 may be designed to be 20% of length 1702. Such ratio may be selected according to estimated mechanical stress and/or based on predicted movement or vibration of selected applications. Additionally, or alternatively, width 1706 may be selected according to the thickness of comb electrode 1302. For example, width 1706 may be selected to be 10-50 times the thickness of comb electrode 1302.

Similarly, the dimensions of the contact may be designed based on distances or measurements of comb length 1702. For example, contact width 1708 and contact length 1704 may be designed to be 10% of length 1702. Additionally, or alternatively, contact width 1708 and contact length 1704 may be selected according comb electrode thickness 1310, as defined by conductive layer 1202 (see FIG. 12). For example, contact width 1708 and contact length 1704 may be designed to be 10 times the thickness of comb electrode 1302. In some embodiments, as shown in FIG. 17, contact width 1708 and contact length 1704 may have similar dimensions (or be the same). But in other embodiments, contact width 1708 and contact length 1704 may have different dimensions from each other. For example, in some embodiments contact width 1708 may be twice contact length 1704.

As shown in FIG. 17, combs or electrodes may be spaced apart by pitch distances 1710A-1710B. In some embodiments, pitch distances 1710A-1710B may be uniform and constant throughout the device. In such embodiments, pitch distances 1710A-1710B may be based on width 1706. For example, pitch distances 1710A-1710B may be greater than one third of width 1706. In other embodiments, pitch distances 1710A-1710B may be based on length 1702. For example, pitch distances 1710A-1710B may be 10-30% length 1702.

Figure 18A:
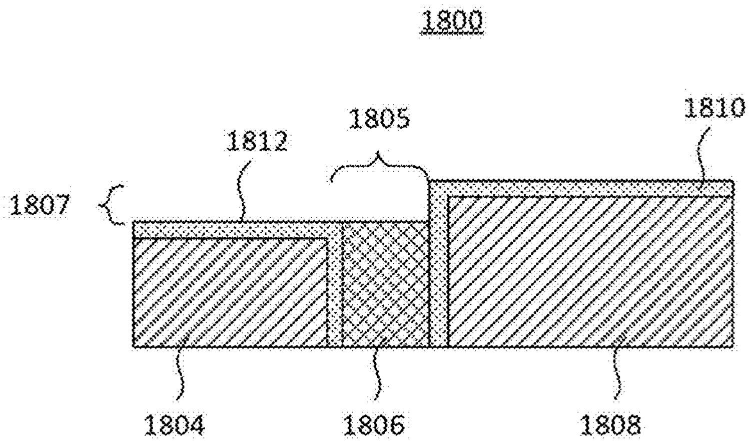
FIG. 18A shows a cross-sectional view of a first partial structure formed during an exemplary manufacturing process for forming a semiconductor structure in accordance with embodiments of the present disclosure.

FIG. 18A shows a cross-sectional view of a first partial structure 1800 formed during an exemplary manufacturing process for forming a semiconductor structure in accordance with embodiments of the present disclosure. In some embodiments, first partial structure 1800 may be part of a MEMS drive structure. First partial structure 1800 may be part of a greater overall structure. For example, first partial structure 1800 may be part of a broader structure, like fifth structure 500, but focused on a specific area of the structure (such as focus area 1650). As shown in FIG. 18A, first partial structure 1800 may include a first polysilicon pedestal 1804, a silicon separator 1806, and a second polysilicon pedestal 1808. Additionally, first partial structure 1800 may include a first conformal insulator 1810 and a second conformal insulator 1812. In some embodiments, first polysilicon pedestal 1804 and second polysilicon pedestal 1808 may be formed, or be part, of polysilicon pedestals 504 (see FIG. 5); silicon separator 1806 may be formed, or be part of, unetched sections 204A-204E; and first conformal insulator 1810 and second conformal insulator 1812 may be formed, or be part of, first conformal insulator 302.

As shown in FIG. 18A, silicon separator 1806 may have a separator width 1805. Separator width 1805 may be in the range of 0.05 um to 50 um. In some embodiments, separator width 1805 may be a function of other dimensions in the structure. For example, separator width 1805 may be a fraction of the width of first polysilicon pedestal 1804. In some embodiments, separator width 1805 may be one half of the width of first polysilicon pedestal 1804.

As shown in FIG. 18A, in some embodiments first polysilicon pedestal 1804 and second polysilicon pedestal 1808 may have a different height. In some embodiments the height difference may be formed during etch back processes, as discussed in connection with FIG. 5. In such embodiments, first polysilicon pedestal 1804 and second polysilicon pedestal 1808 may be formed with different compositions that have different etch rates with respect to a specific selective etchant. For example, while first polysilicon pedestal 1804 may etch at a rate of 1 um/s, second polysilicon pedestal 1808 may etch at a rate of 0.8 um/s when exposed to a specific etchant. The difference in etch rates may result in different heights, as shown in FIG. 18A, which may be used for the formation of MEMS drive structures. Thus, as shown in FIG. 18A, a height difference 1807 may be formed between first polysilicon pedestal 1804 and second polysilicon pedestal 1808. Height difference 1807 may be tailored according to specific applications and in some embodiments may be between 0.01 um and 10 um. Further, in some embodiments first polysilicon pedestal 1804 and second polysilicon pedestal 1808 may have substantially similar height in which the difference of height is less than 0.5 um.

Figure 18B:
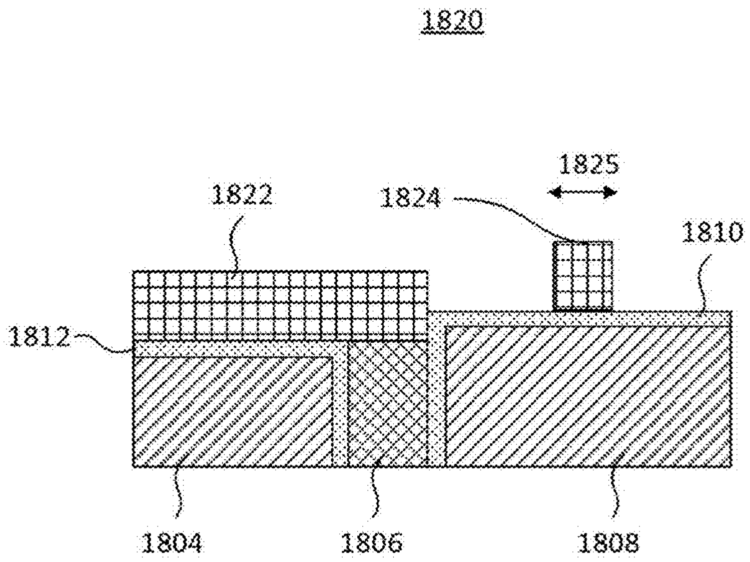
FIG. 18B shows a cross-sectional view of a second partial structure formed during the exemplary manufacturing process for forming a semiconductor structure.

FIG. 18B shows a cross-sectional view of a second partial structure 1820 formed during the exemplary manufacturing process for forming a semiconductor structure. As shown in FIG. 18B, second partial structure 1820 may include first polysilicon pedestal 1804, silicon separator 1806, second polysilicon pedestal 1808, first conformal insulator 1810, and second conformal insulator 1812. Additionally, second partial structure 1820 may include first patterned photoresist 1822 and second patterned photoresist 1824.

In some embodiments, second partial structure 1820 may be formed by patterning photoresist on first partial structure 1800. For example, photoresist may be spin coated on first partial structure 1800 and perform photolithography to form first patterned photoresist 1822 and second patterned photoresist 1824. In some embodiments, first patterned photoresist 1822 and second patterned photoresist 1824 may be formed with, or be part of, patterned photoresist layer 702. The photoresist layers may be formed with photolithography techniques described above and may be formed in preparation of partial etching of second polysilicon pedestal 1808, as further discussed in connection with FIG. 8. In some embodiments, first patterned photoresist 1822 and second patterned photoresist 1824 may be formed with the same material and have the same thicknesses and compositions. In some embodiments, first polysilicon pedestal 1804 and second polysilicon pedestal 1808 may be formed, or be part, of polysilicon pedestals 504 (see FIG. 8); silicon separator 1806 may be formed, or be part of, unetched sections 204A-204E; and first conformal insulator 1810 and second conformal insulator 1812 may be formed, or be part of, first conformal insulator 302 (see FIG. 8).

In some embodiments, as shown in FIG. 18B second patterned photoresist 1824 may have a photoresist width 1825. In some embodiments, photoresist width 1825 may be selected between 0.01 and 10 um. For example, photoresist width 1825 may be of about 2.5 um (e.g., 2.5 um+/−1 um).

Figure 18C:
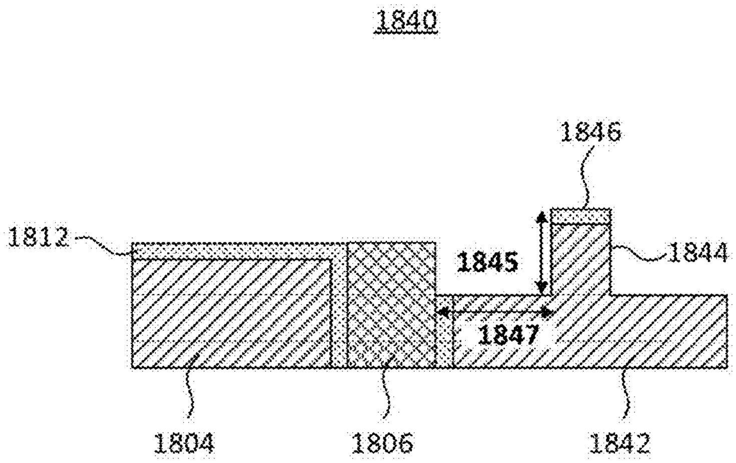
FIG. 18C shows a cross-sectional view of a third partial structure formed during the exemplary manufacturing process for forming a semiconductor structure.

FIG. 18C shows a cross-sectional view of a third partial structure 1840 formed during the exemplary manufacturing process for forming a semiconductor structure. As shown in FIG. 18C, third partial structure 1840 may include first polysilicon pedestal 1804, silicon separator 1806, and second conformal insulator 1812. Additionally, third partial structure 1840 may include an etched pedestal 1842, including a protrusion 1844 and top insulator 1846.

In some embodiments, third partial structure 1840 may be formed by partially etching second polysilicon pedestal 1808 of second partial structure 1820. For example, as further discussed in connection with FIG. 8, an anisotropic etching technique may be used to partially etch areas of second polysilicon pedestal 1808 that are not covered with photoresist. In such embodiments, areas that are not covered by second patterned photoresist 1824 in second partial structure 1820 may be partially etched with a process like DRIE. As shown in FIG. 18C, as part of the etch process to form protrusion 1844, first conformal insulator 1810 may be partially etched leaving only top insulator 1846.

As shown in FIG. 18C, etched pedestal 1842 may be etched to an etch depth 1845 to form protrusion 1844. Etch depth 1845 may be controlled based on timing of the etching process. In other embodiments, however, etch depth 1845 may be controlled using etch stop layers. In some embodiments, etch depth 1845 may be selected to be between 0.01 um and 10 um. For example, etch depth 1845 may be of about 1.5 um (e.g., 1.5 um+/−0.5 um). In some embodiments, as shown in FIG. 18C protrusion 1844 may have a width matching photoresist width 1825.

Additionally, as shown in FIG. 18C, a separator distance 1847 may be formed in third partial structure 1840. Separator distance 1847 may be selected based on specific applications and/or microfabrication procedures. In some embodiments, separator distance 1847 may be selected to be between 0.05 um and 50 um, depending on the targeted application. For example, depending of the expected mobility and or vibration of comb electrodes or electrodes, separator distance 1847 may be selected to be greater or smaller. In some embodiments, separator distance 1847 may be selected as a function of comb electrode thickness 1310. For example, separator distance 1847 may be selected as 5 times the comb electrode thickness 1310 to provide ample support to the structure.

Figure 18D:
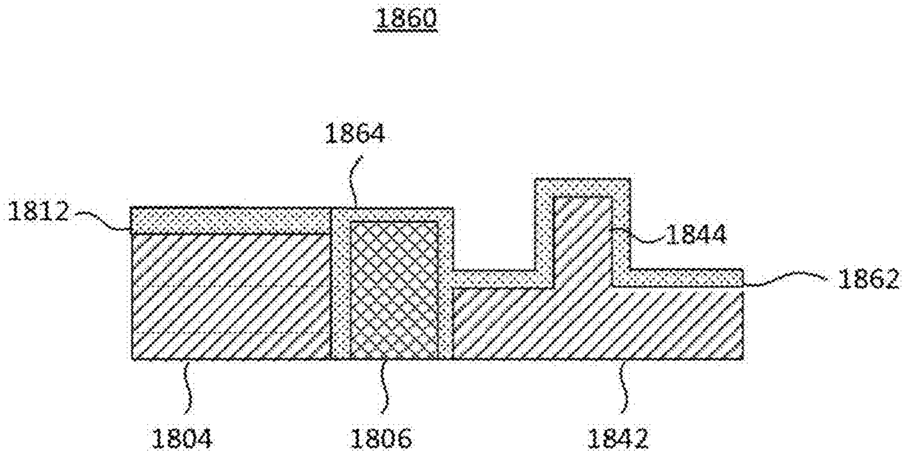
FIG. 18D shows a cross-sectional view of a fourth partial structure formed during the exemplary manufacturing process for forming a semiconductor structure.

FIG. 18D shows a cross-sectional view of a fourth partial structure 1860 formed during the exemplary manufacturing process for forming a semiconductor structure. As shown in FIG. 18D, fourth partial structure 1860 may include first polysilicon pedestal 1804, silicon separator 1806, second conformal insulator 1812, and etched pedestal 1842—including a protrusion 1844. Additionally, fourth partial structure 1860 may include insulation layers 1864 and 1862.

In some embodiments, fourth partial structure 1860 may be formed by depositing insulation layers 1864 and 1862 on third partial structure 1840 using processes like thermal oxidation, CVD, evaporation, or epitaxial growth. Insulation layers 1864 and 1862 may be used to create insulation and/or surfaces with better adhesion. Insulation layers 1864 and 1862 may be formed of oxides, nitrides, oxynitrides, or any other material suitable to form an insulation or passivation layer.

Figure 18E:
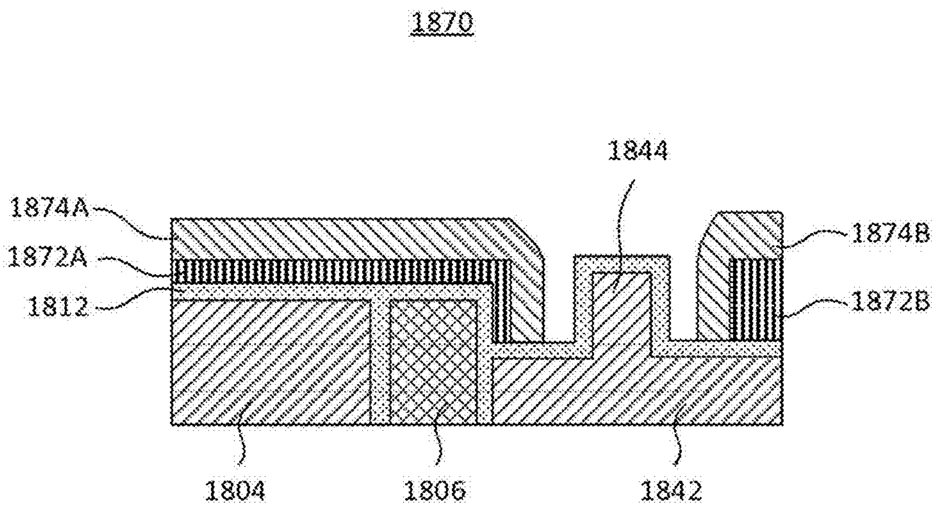
FIG. 18E shows a cross-sectional view of a fifth partial structure formed during the exemplary manufacturing process for forming a semiconductor structure.

FIG. 18E shows a cross-sectional view of a fifth partial structure 1870 formed during the exemplary manufacturing process for forming a semiconductor structure. As shown in FIG. 18E, fifth partial structure 1870 may include first polysilicon pedestal 1804, silicon separator 1806, second conformal insulator 1812, and etched pedestal 1842—including protrusion 1844. Additionally, fifth partial structure 1870 may include insulation layers, first patterned polysilicon layer 1872A-1872B (formed from a first polysilicon layer 1872, not shown) and second patterned polysilicon layer 1874A-1874B (formed from a second polysilicon layer 1874, not shown).

In some embodiments, fifth partial structure 1870 may be formed by depositing first polysilicon layer 1872 and second polysilicon layer 1874 and then selectively etching them to form first patterned polysilicon 1872A-1872B and second patterned polysilicon 1874A-1874B. As discussed in connection with FIGS. 10-11, deposition and etching of polysilicon layers may be done in different stages. In some embodiments, first polysilicon layer 1872 and second polysilicon layer 1874 may correspond to second polysilicon layer 1002 and a third polysilicon layer 1004, respectively. In such embodiments, a first stage of polysilicon formation may involve deposition, etching, and annealing of first polysilicon layer 1872, while a second stage may involve deposition, etching, and annealing of second polysilicon layer 1874. In other embodiments, however, stages may be combined. For example, first polysilicon layer 1872 and second polysilicon layer 1874 may be deposited one after the other and etched in a single etching step. Additionally, or alternatively, first polysilicon layer 1872 and second polysilicon layer 1874 may be annealed together, in a single annealing step.

Moreover, in some embodiments first polysilicon layer 1872 and second polysilicon layer 1874 may be formed as two independent layers. In other embodiments, however, these two polysilicon layers may be combined. For example, a single polysilicon layer may be employed in fifth partial structure 1870.

Figure 18F:
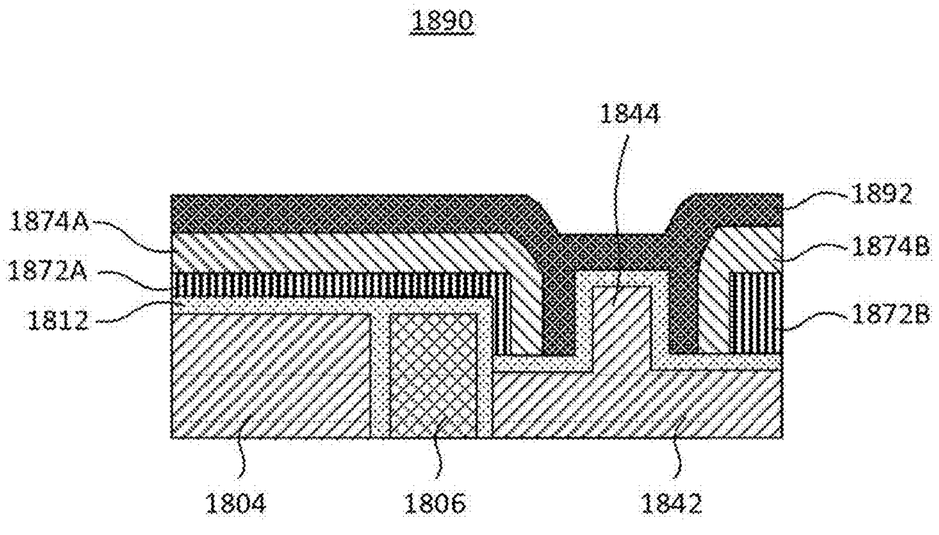
FIG. 18F shows a cross-sectional view of a sixth partial structure formed during the exemplary manufacturing process for forming a semiconductor structure.

FIG. 18F shows a cross-sectional view of a sixth partial structure 1890 formed during the exemplary manufacturing process for forming a semiconductor structure. As shown in FIG. 18E, sixth partial structure 1890 may include first polysilicon pedestal 1804, silicon separator 1806, second conformal insulator 1812, etched pedestal 1842 (including protrusion 1844), first patterned polysilicon 1872A-1872B and second patterned polysilicon 1874A-1874B, and a conductive layer 1892, patterned conformally to create a comb structure.

In some embodiments, sixth partial structure 1890 may be formed by depositing conductive layer 1892 over fifth partial structure 1870. For example, as further discussed in connection with FIGS. 12-13, a conformal conductive layer may be deposited using evaporation techniques to create a conductive layer that conforms to protrusion 1844 and first patterned polysilicon 1872A-1872B and second patterned polysilicon 1874A-1874B.

Figure 19:
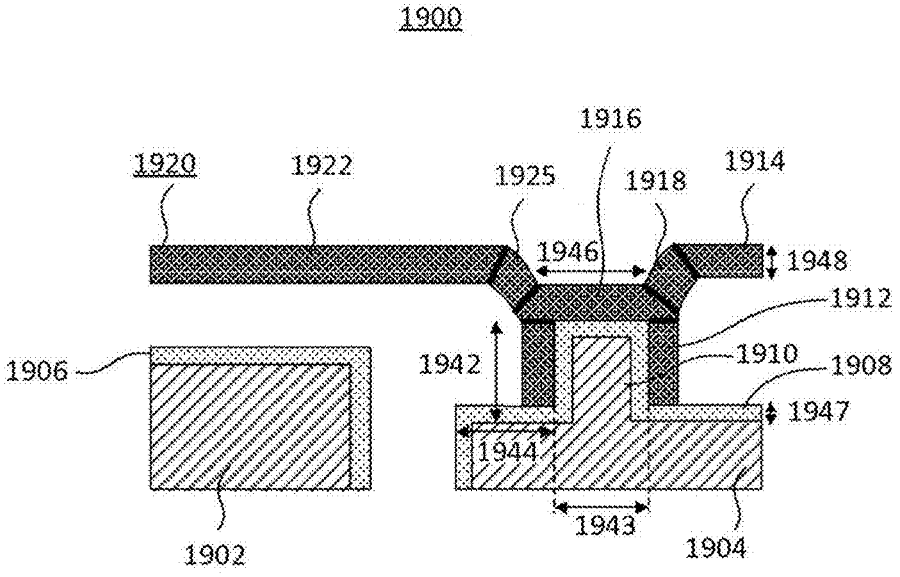
FIG. 19 shows a cross-sectional view of a first exemplary embodiment of a semiconductor device in accordance with embodiments of the present disclosure.

FIG. 19 shows a cross-sectional view of a first exemplary embodiment 1900 of a semiconductor device in accordance with embodiments of the present disclosure. In some embodiments, first exemplary embodiment 1900 may be formed using the processes described above with reference to FIGS. 1-16 and/or FIGS. 18A-18E. For example, first exemplary embodiment 1900 may be formed by performing a silicon and polysilicon release etch that etches away polysilicon and silicon layers, etching silicon separator 1806, first patterned polysilicon 1872A-1872B, and second patterned polysilicon 1874A-1874B to form first exemplary embodiment 1900. Additionally, or alternatively, first exemplary embodiment 1900 may be fabricated using the process described with reference to FIGS. 1-16. In such embodiments, first exemplary embodiment 1900 may be the device generated in focus area 1650 of FIG. 16, As shown in FIG. 19, first exemplary embodiment 1900 may include first polysilicon pedestal 1902, second polysilicon pedestal 1904, and a metal structure 1920. As shown in FIG. 19, first polysilicon pedestal 1902 and second polysilicon pedestal 1904 may be covered with insulator layers 1906 and 1908, respectively.

Additionally, as shown in FIG. 19, second polysilicon pedestal 1904 may include a protrusion 1910, which may be formed with etching methods previously discussed with respect to FIGS. 8 and 18A-18F. In some embodiments, protrusion 1910 may have a protrusion height 1942 and a protrusion width 1943. Protrusion height may be selected between 0.01 um and 10 um (e.g., around 1.5 um) and protrusion width 1943 may be between 0.02 and 20 um (e.g., around 2.5 um). In some embodiments, protrusion height 1942 may be greater than protrusion width 1943. For example, protrusion height 1942 may be 1.5 times protrusion width 1943. In other embodiments, however, protrusion height 1942 may be smaller than protrusion width 1943. In such embodiments, protrusion height 1942 may be at least 20% of the protrusion width 1943.

Moreover, protrusion 1910 may be fabricated to be at a distance 1944 from an edge of second polysilicon pedestal 1904. In some embodiments, distance 1944 may be selected to be between 0.01 um and 10 um (e.g., around 1 um). Additionally, or alternatively, distance 1944 may be selected to be greater than 1 um to protect structure integrity. For example, to avoid breakoffs during operation, distance 1944 may be selected to be at least 1 um.

Moreover, insulator layers 1906 and 1908 may have a thickness 1947, which may be selected to be between 0.01 um and 10 um. In some embodiments, thickness 1947 may be selected based on the proportion of other measurements on first exemplary embodiment 1900. For example, thickness 1947 may be selected to be 10% of protrusion width 1943 or 20% of protrusion height 1942.

In some embodiments, in which insulator layers 1906 and 1908 are part of first exemplary embodiment 1900, protrusion height 1942 and protrusion width 1943 may include thickness 1947. For example, as shown in FIG. 19, protrusion height 1942 may be equivalent to the etch depth from second polysilicon pedestal 1904 and thickness 1947. Similarly, protrusion width 1943 may be equivalent to the width of the unetched second polysilicon pedestal 1904 and thickness 1947. In other embodiments, for example when there is no insulator layers 1906 and 1908 or when insulator layers 1906 and 1908 are thin (e.g., when grown through thermal oxidation), protrusion height 1942 and protrusion width 1943 may only refer to etched second polysilicon pedestal 1904.

Metal structure 1920 may have different portions and their proportions may be a function of other dimensions in the structure. FIG. 19 shows metal structure 1920 divided in different portions marked by black bands. These black bands, however, are shown for illustration purposes to illustrate the different portions or sections of metal structure 1920. The bands do not imply separate structures but are shown to illustrate the different portions or sections in metal structure 1920. As further discussed below, metal structure 1920 may be formed with a single structure (e.g., comb structure 1302). In other embodiments, however, metal structure 1920 may include different structures.

In some embodiments, metal structure 1920 may include a first portion 1912 surrounding protrusion 1910, a second portion 1922 substantially parallel to the top surface of second polysilicon pedestal 1904, and a third portion 1925 connecting first portion 1912 and second portion 1922. As shown in FIG. 19, in some embodiments second portion 1922 may extend towards first polysilicon pedestal 1902. And, in some embodiments, second portion 1922 may be higher and longer than first portion 1912. Moreover, in some embodiments third portion 1925 may have an oblique shape, connecting first portion 1912 and second portion 1922.

Moreover, as further discussed in connection with FIG. 17, metal structure 1920 may have a width that is determined based on contact areas, thickness of metal structure 1920, and/or length 1702.

As shown in FIG. 19, metal structure 1920 may also include a fourth portion 1914 substantially parallel to the top surface of second polysilicon pedestal 1904 and connected to first portion 1912 via a fifth portion 1918. As shown, fourth portion 1914 may have similar height as second portion 1922 but be shorter in length. Further as shown in FIG. 19, metal structure 1920 may also include a sixth portion 1916 on top of protrusion 1910 having a top width 1946. In some embodiments, fourth portion 1914 may extend away from first polysilicon pedestal 1902.

In some embodiments, as shown in FIG. 19, first portion 1912, second portion 1922, third portion 1925, fourth portion 1914, fifth portion 1918, and sixth portion 1916 may be for of a single continuous metal structure 1920. In other embodiments, however, first portion 1912, second portion 1922, third portion 1925, fourth portion 1914, fifth portion 1918, and sixth portion 1916 may not be part of a single continuous structure and be formed via amalgamation of multiple structures arranged with the connections and characteristics described in FIG. 19.

Although not shown, in some embodiments, the first exemplary embodiment 1900 may be mirrored vertically (that is, having an equivalent structure with a left polysilicon pillar). In such embodiments, as discussed in connection with FIGS. 16 and 24A-24B, metal structure 1920 may bridge second polysilicon pedestal 1904 with a third polysilicon pedestal (not shown). In such embodiments both second polysilicon pedestal 1904 and the third polysilicon pedestal each may include its own protrusion (as indicated in FIG. 17). In such embodiments, metal structure 1920 may further include a seventh portion surrounding a second protrusion in a different polysilicon pedestal, and an eighth portion connecting the fourth portion and the second portion.

In some embodiments, first portion 1912 is not less than ⅕ of the length of second portion 1922, and the length of first portion 1912 is not less 1/10 of the length of second portion 1922. Additionally or alternatively, first portion 1912 has a width not less than ⅕ of the length of second portion 1922. These ratios may improve the stability of electrodes while permitting sufficient movement, enhancing both sensitivity and robustness.

FIG. 20 shows a cross-sectional view of a second exemplary embodiment 2000 of a semiconductor device in accordance with embodiments of the present disclosure. As shown in FIG. 20, second exemplary embodiment 2000 may include a first polysilicon pedestal 2002, a second polysilicon pedestal 2004, and a metal structure 2020. As shown in FIG. 20, first polysilicon pedestal 2002 and second polysilicon pedestal 2004 may be covered with insulator layers 2006 and 2008, respectively. Similar to FIG. 19, FIG. 20 shows metal structure 2020 divided in different portions marked by black bands. These black bands, however, are shown for illustration purposes to illustrate the different portions or sections of metal structure 2020. The bands do not imply separate structures, but are shown to illustrate the different portions or sections in metal structure 2020.

In some embodiments, second exemplary embodiment 2000 may be formed using the processes described above with reference to FIGS. 1-16 and/or FIGS. 18A-18E. For example, second exemplary embodiment 2000 may be formed with the processes described in FIGS. 1-16 but performing a different etching process to form a protrusion that has the profile or shape shown in FIG. 20. For example, second exemplary embodiment 2000 may be formed by using an anisotropic etch to form protrusions 804 in eighth structure 800. In such embodiments, second exemplary embodiment 2000 may be the device generated in focus area 1650 of FIG. 16. Additionally, or alternatively, second exemplary embodiment 2000 may be fabricated only using the process described above with reference to FIGS. 18A-18F. But instead of using the etching process described in connection with FIG. 18C, forming second exemplary embodiment 2000 may employ a different type of etching and/or photoresist lithography to generate the structure shown in FIG. 20.

Second exemplary embodiment 2000 may have similar dimensions, positions, and components as first exemplary embodiment 1900, but the shape, size, and function of the protrusion may be different. While protrusion 1910 in first exemplary embodiment 1900 vertical walls, protrusion 2010 in second exemplary embodiment 2000 may include slanted walls. These type of walls in protrusion 2010 may facilitate fabrication, allow use of different etching procedures, and/or increase the surface area of protrusion 2010 to improve adhesion between second polysilicon pedestal 2004 and metal structure 2020.

Similar to first exemplary embodiment 1900, second exemplary embodiment 2000 may include protrusion 2010 having a protrusion height 2042. Protrusion 2010 may have a top protrusion width 2043 and a bottom protrusion width 2045. Additionally, or alternatively, top protrusion width 2043 may be associated with a top area (e.g., the area defined by the top of protrusion 2010) while bottom protrusion width 2045 may be associated with a bottom area (e.g., the area defined by the bottom of protrusion 2010).

As shown in FIG. 20, in some embodiments top protrusion width 2043 may be smaller than bottom protrusion width 2045. In such embodiments, top protrusion width 2043 may be 50% of bottom protrusion width 2045. In other embodiments, however, alternative configurations may be selected based on etching procedures and target application. Moreover, protrusion 2010 may be fabricated to be at a distance 2044 from an edge of second polysilicon pedestal 2004.

Further, similar to first exemplary embodiment 1900, second exemplary embodiment 2000 may include insulator layers 2006 and 2008 having a thickness 2047. Further, metal structure 2020 may have different portions including first portion 2012, second portion 2022, third portion 2025, fourth portion 2014, fifth portion 2018, and sixth portion 2016 having a top width 2046. Further, similar to first exemplary embodiment 1900, protrusion height 2042, bottom protrusion width 2045, and top protrusion width 2043 may include thickness 2047. In other embodiments, however, for example when there are no insulator layers 2006 and 2008 or when insulator layers 2006 and 2008 are thin (e.g., when grown through thermal oxidation), protrusion height 2042, bottom protrusion width 2045, and top protrusion width 2043 may only refer to etched second polysilicon pedestal 2004.

FIG. 21 shows a cross-sectional view of a third exemplary embodiment 2100 of a semiconductor device in accordance with embodiments of the present disclosure. As shown in FIG. 21, third exemplary embodiment 2100 may include first polysilicon pedestal 2102, second polysilicon pedestal 2104, and a metal structure 2120. As shown in FIG. 21, first polysilicon pedestal 2102 and second polysilicon pedestal 2104 may be covered with insulator layers 2106 and 2108, respectively. Similar to FIG. 19, FIG. 21 shows metal structure 2120 divided in different portions marked by black bands. These black bands, however, are shown for illustration purposes to illustrate the different portions or sections of metal structure 2120. The bands do not imply separate structures, but are shown to illustrate the different portions or sections in metal structure 2120.

In some embodiments, third exemplary embodiment 2100 may be formed using the processes described above with reference to FIGS. 1-16 and/or FIGS. 18A-18F. For example, third exemplary embodiment 2100 may be formed with the processes described in FIGS. 1-16 but performing a different etching process to form a protrusion that has the profile or shape shown in FIG. 21. For example, third exemplary embodiment 2100 may be formed by using an anisotropic etch selected for a specific crystal orientation to form protrusions 804 in eighth structure 800 having the inverted walls shown in FIG. 21. In such embodiments, second exemplary embodiment 2000 may be the device generated in focus area 1650 of FIG. 16. Additionally, or alternatively, second exemplary embodiment 2000 may be fabricated only using the process described with reference to FIGS. 18A-18F. But instead of using the etching process described in connection with FIG. 18C, forming third exemplary embodiment 2100 may employ a different type of etching and/or photoresist lithography to generate the structure shown in FIG. 21.

Third exemplary embodiment 2100 may have similar dimensions, positions, and components as first exemplary embodiment 1900, but the shape, size, and function of the protrusion may be different. While protrusion 1910 in first exemplary embodiment 1900 has vertical walls, protrusion 2110 in third exemplary embodiment 2100 may use inverted walls. These type of walls in protrusion 2110 may enhance stability of the structure and improve its robustness during operation. For example, structures with protrusion 2110 may be less prone to debonding or detachment in operation of MEMS drive. Protrusion 2110 may be fabricated using anisotropic etching of second polysilicon pedestal 2104 using, for example, KOH to etch on a particular crystalline direction. Additionally, or alternatively, protrusion 2110 may be formed using timed isotropic etchants to carve out specific portions of the polysilicon. Moreover, the fabrication of metal structure 2120 may be achieved with methods of evaporation using lower deposition rates and intervening reflow steps to achieve coverage below direct line of sight from the evaporation source.

Similar to first exemplary embodiment 1900, third exemplary embodiment 2100 may include protrusion 2110 having a protrusion height 2142. But protrusion 2110 may have a top protrusion width 2143 and a bottom protrusion width 2145. As shown in FIG. 21, in some embodiments top protrusion width 2143 may be larger than bottom protrusion width 2145. In such embodiments, top protrusion width 2043 may be 150% of bottom protrusion width 2045. In other embodiments, however, alternative configurations may be selected based on etching procedures and target application. Moreover, protrusion 2110 may be fabricated to be at a distance 2144 from an edge of second polysilicon pedestal 2004.

Further, similar to first exemplary embodiment 1900, third exemplary embodiment 2100 may include insulator layers 2106 and 2108 having a thickness 2147. Metal structure 2120 may have different portions including first portion 2112, second portion 2122, third portion 2125, fourth portion 2114, fifth portion 2118, and sixth portion 2116 having a top width 2146. Further, similar to first exemplary embodiment 1900, protrusion height 2142, bottom protrusion width 2145, and top protrusion width 2143 may include thickness 2147. In other embodiments, however, for example when there are no insulator layers 2106 and 2108 or when insulator layers 2106 and 2108 are thin (e.g., when grown through thermal oxidation), protrusion height 2142, bottom protrusion width 2145, and top protrusion width 2143 may only refer to etched second polysilicon pedestal 2004.

FIG. 22 shows a cross-sectional view of a fourth exemplary embodiment 2200 of a semiconductor device in accordance with embodiments of the present disclosure. As shown in FIG. 22, fourth exemplary embodiment 2200 may include first polysilicon pedestal 2202, second polysilicon pedestal 2204, and a metal structure 2220. As shown in FIG. 22, first polysilicon pedestal 2202 and second polysilicon pedestal 2204 may be covered with insulator layers 2206 and 2208, respectively. Similar to FIG. 19, FIG. 22 shows metal structure 2220 divided in different portions marked by black bands. These black bands, however, are shown for illustration purposes to illustrate the different portions or sections of metal structure 2220. The bands do not imply separate structures, but are shown to illustrate the different portions or sections in metal structure 2220.

In some embodiments, fourth exemplary embodiment 2200 may be formed using the processes described above with reference to FIGS. 1-16 and/or FIGS. 18A-18F. For example, fourth exemplary embodiment 2200 may be formed with the processes described in FIGS. 1-16 but performing a different etching process to form a protrusion that has the profile or shape shown in FIG. 22. For example, fourth exemplary embodiment 2200 may be formed by changing the photolithography to form seventh structure 700 to generate a series of protrusions with intervening trenches, as shown in FIG. 22. For example, the photolithography may be modified to create additional first exposure areas 708A-708B. In such embodiments, second exemplary embodiment 2000 may be the device generated in focus area 1650 of FIG. 16. Additionally, or alternatively, second exemplary embodiment 2000 may be fabricated only using the process described with reference to FIGS. 18A-18F. But instead of creating the photolithography pattern described in connection with FIG. 18B, generating a different pattern for the formation of multiple protrusions with intervening trenches, as shown in FIG. 22.

Fourth exemplary embodiment 2200 may have similar dimensions, portions, and components as first exemplary embodiment 1900, but the shape, size, and function of the protrusion may be different. While protrusion 1910 in first exemplary embodiment 1900 includes vertical walls, protrusions 2210A-2210B in fourth exemplary embodiment 2200 may use a series of protrusions having intervening trenches 2230 within the protrusion region. Having multiple protrusions 2210A-2210B, as shown in FIG. 22, may enhance stability of the structure and improve its robustness during operation to minimize failures. For example, structures using protrusions 2210 may be more robust as debonding of anchors in one protrusion does not result in complete comb debonding. Protrusions 2210 may be fabricated in a similar way as protrusion 1910 but using a different photolithography process to define multiple protrusions, instead of a single one. However, while there may be differences in the protrusion photolithography, the same type of etching can be used for partially etching second polysilicon pedestal 2204. For example, formation of protrusions 2210 may be achieved with the same DRIE process discussed in connection with FIG. 8.

Similar to first exemplary embodiment 1900, fourth exemplary embodiment 2200 may include protrusions 2210A-2210B having a protrusion height 2142 and protrusion widths 2143A-2143B. But protrusion 2110 may have multiple pieces or positions with intervening trenches that serve as additional anchor points to metal structure 2120. In some embodiments, protrusion widths 2143A-2143B may be substantially similar. In other embodiments, protrusion widths 2143A-2143B may be selected to be different based on target applications and/or to enhance certain aspects of metal structure 2220. For example, if more movement is desired from one side of metal structure 2220, one of protrusion widths 2143A-2143B may be selected to be narrower than the other.

Further, similar to first exemplary embodiment 1900, fourth exemplary embodiment 2200 may include insulator layers 2206 and 2208 having a thickness 2247. Further, metal structure 2220 may have different portions including first portion 2212, second portion 2222, third portion 2225, fourth portion 2214, fifth portion 2218, and sixth portion 2216, having a top width 2246.

Figure 23:
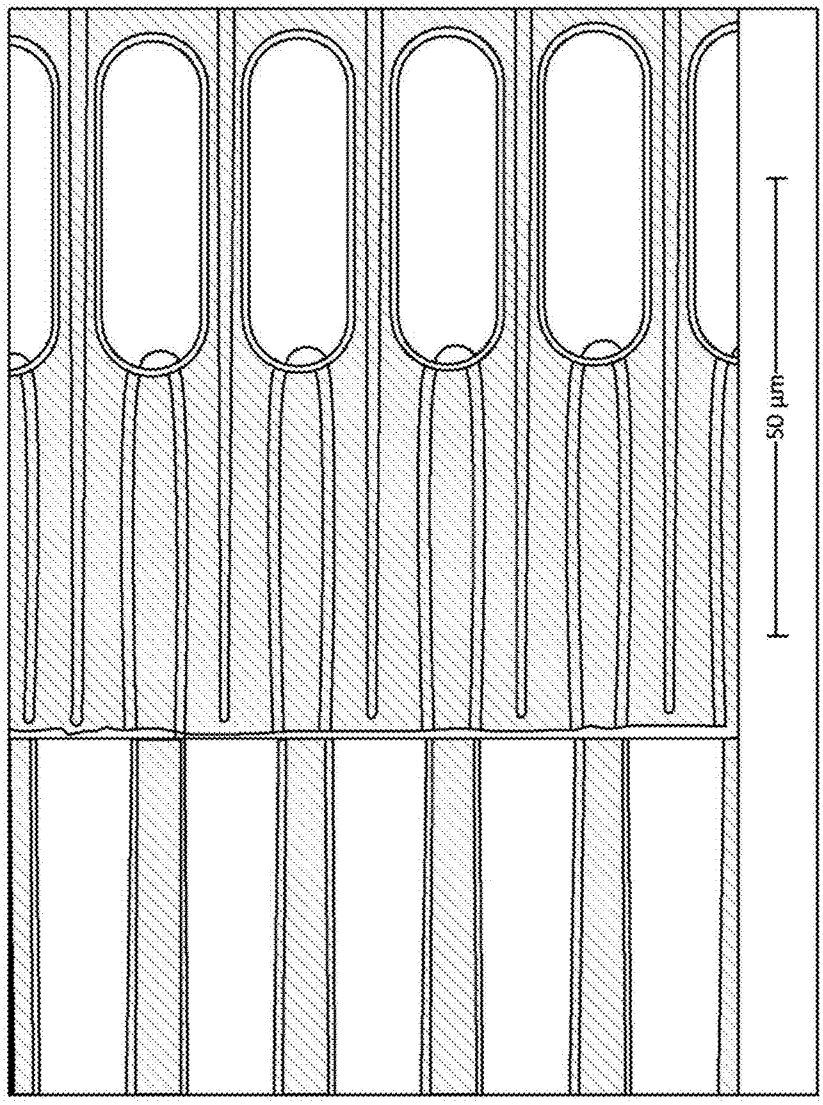
FIG. 23 shows a top-view schematic of an exemplary semiconductor device in accordance with embodiments of the present disclosure.

FIG. 23 shows a top-view schematic 2300 of an exemplary semiconductor device in accordance with embodiments of the present disclosure. FIG. 23 shows a top view schematic of comb electrodes 1302 formed substantially parallel form one another and having a protective layer 1402 that covers the combs. As shown in FIG. 23, the protective layer need not follow the shape of combs and may have alternative shapes include oval openings. FIG. 23 also show relative lengths of the different comb electrodes fabricated with methods and configurations according to disclosed embodiments.

In some embodiments, protective layer 1402 may include a protective dielectric film formed with at least one of silicon oxide, silicon nitride, silicon carbide, fluorosilicate glass, undoped silicate glass, or borophosphosilicate glass.

Figure 24B:
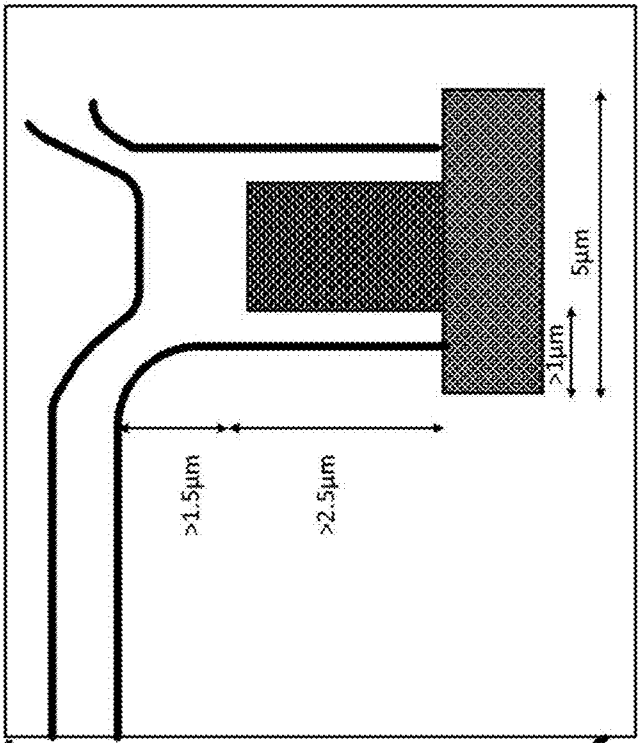
FIG. 24B shows a side-view schematic of an exemplary semiconductor device that is an inset of FIG. 24A, in accordance with embodiments of the present disclosure.
Figure 24A:
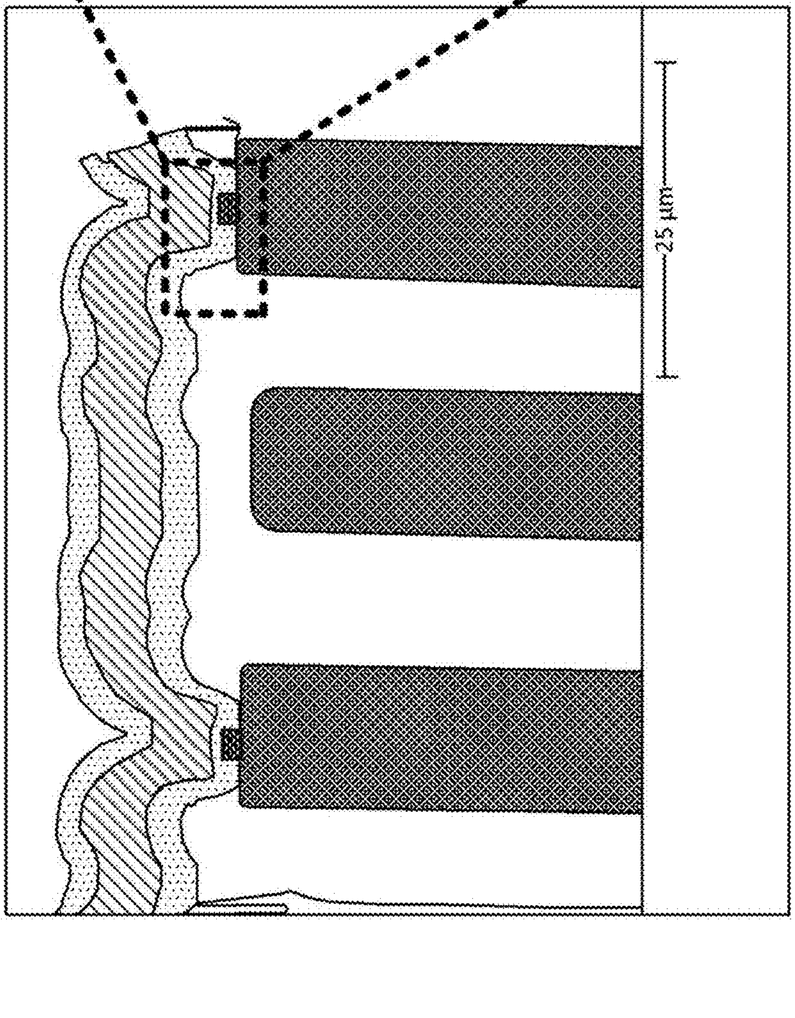
FIG. 24A shows a side-view schematic of an exemplary semiconductor device in accordance with embodiments of the present disclosure.

FIG. 24A shows a side-view 2400 of an exemplary semiconductor device in accordance with embodiments of the present disclosure. FIG. 24A shows a side view schematic of comb electrodes 1302 formed substantially parallel with one another and having a protective layer 1402 that covers the combs. As shown in FIG. 24A, combs may form bridges between alternating polysilicon pedestals Thus, the metal structure may connect left and right polysilicon pedestals, passing over the middle polysilicon pedestal. In such embodiments, left and right pedestals, supporting the comb bridge would have its own protrusion. And, as shown in FIGS. 16 and 18F, the metal structure may include portions that surround protrusions in each of the pedestals.

As shown in top view in FIG. 23 and side view n FIG. 24A, multiple combs or bridge structures may be fabricated to form a MEMS drive in which each of the combs is more robust, enabling additional applications and/or permitting greater movement ranges.

FIG. 24B shows a side-view image 2450 of an exemplary semiconductor device in accordance with embodiments of the present disclosure. FIG. 24B is an inset of FIG. 24A showing a specific portion of the structure (similar to focus area 1650 at greater magnification). FIG. 24B also shows exemplary dimensions of the structure showing a width of the polysilicon pedestal of around 4.6 um, a height of the comb structure of at least 1.3 um, and a distance between the edge of the polysilicon pedestal and the protrusion being at least 1 um.

Figure 25:
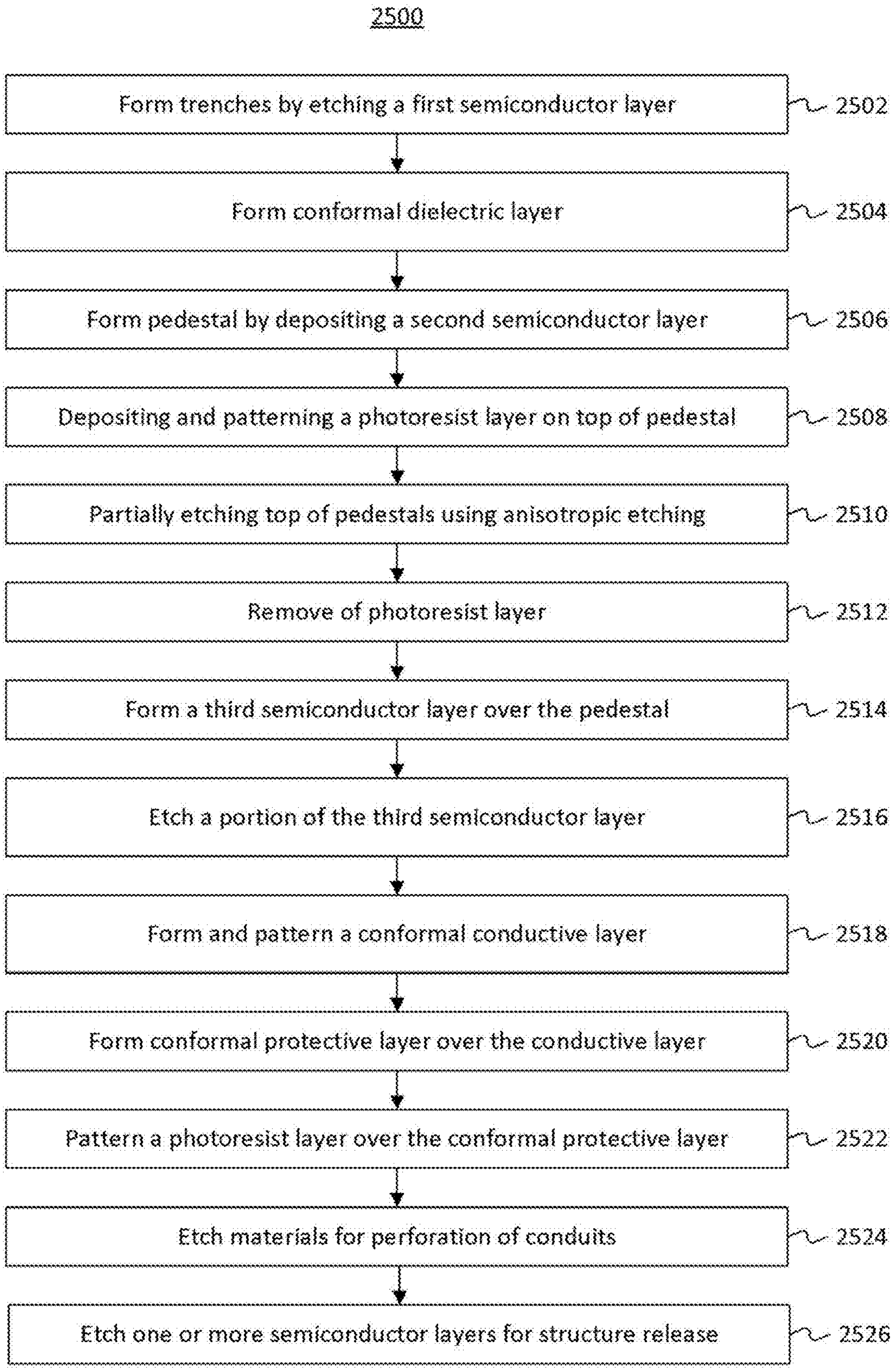
FIG. 25 shows a flow chart of an exemplary manufacturing process for manufacturing a semiconductor device in accordance with embodiment of the present disclosure.

FIG. 25 shows a flow chart of an exemplary manufacturing method 2500 for manufacturing a device in accordance with embodiment of the present disclosure. In some embodiments, method 2500 may follow the steps in the order described in FIG. 25. In other embodiments, however, method 2500 may be performed in different orders, alternating sequences and/or repeating one or more of the steps described in FIG. 25.

Method 2500 may initiate in step 2502. In step 2502, trenches may be formed by etching a first semiconductor layer. For example, as further discussed in connection with FIGS. 1-2, the device layer may be etched to form trenches formed of semiconductor material. In some embodiments, step 2502 may include dry anisotropic etching using deep reactive-ion etching (DRIE). In other embodiments, step 2502 may include other types of etching including wet and/or mechanical etching.

In step 2504, a conformal dielectric layer may be formed. In some embodiments, a dielectric layer may be grown so that it coats the etched semiconductor layers of step 2502. For example, the first semiconductor layer may be oxidized to form the conformal dielectric layer. In other embodiments, however, the dielectric layer may be formed with CVD and/or atomic layer deposition (ALD) CVD.

In step 2506, a pedestal may be formed by depositing a second semiconductor layer. In such embodiments, the second semiconductor layer may be deposited through CVD. The second semiconductor layer may have a different composition than the first semiconductor layer of step 2502. For example, while the first semiconductor layer may be formed by single crystal silicon, the second semiconductor layer may be formed with polysilicon layer. In other embodiments, however, the first and second semiconductor layers may use the same and/or similar materials. As further discussed in connection with FIG. 4-5, in some embodiments the formation of pedestals may including the filling of trenches in the first semiconductor material and removal of excess (e.g., using CMP).

In step 2508, a photoresist layer may be formed, deposited, and/or patterned on top of pedestals. For example, in step 2508 photoresist may be spin coated, exposed, and developed to form photoresists layers on the pedestals formed in step 2506. For example, as discussed in connection with FIGS. 6-7, a photoresist layer that covers the entire top of the structure (covering the second semiconductor layer of step 2506) may be deposited and perform photolithography to leave a desired pattern for later etching of pedestals.

In step 2510, etch pedestals may be partially etched using anisotropic etching. For example, as further discussed in connection with FIGS. 8-9, pedestals previously formed may be partially etched to create protrusions in pedestals that can be used as anchors for comb electrodes, cantilevers, and/or bridge structures. In step 2510, the photoresist layer may be uses as a protective layer to only selectively etch specific portions. In some embodiments, the etching in step 2510 can be performed with dry etch processes like Deep RIE. In other embodiments, however, the etching of step 2510 can be performed with wet and/or mechanical etching.

In some embodiments, step 2510 may include the formation of an isolation or passivating layer covering polysilicon and any formed pedestals. For example, as further discussed in connection with FIG. 18D, after partially etching the second pedestal, an isolation layer may be formed on the second pedestal, including covering the protrusion.

In step 2512, the photoresist layer applied in step 2508 may be removed. For example, after completing the etching to form protrusions in step 2510, the photoresist layer patterned in step 2508 may be removed to remove the sacrificial layer.

In step 2514, a third semiconductor layer may be formed. As further discussed in connection with FIGS. 10-11, in some embodiments step 2514 may involve the formation or one or multiple polysilicon layers. Such polysilicon layers may be formed to be conformal and to fill-in trenches in the workpiece. For example, the third semiconductor layer may be formed so that it covers any trenches remaining after the etching of protrusions in step 2510. Additionally, or alternatively, the formation of the third semiconductor layer may include multiple sub-steps. For example, a first sub-step in step 2514 may include the formation, annealing, and polishing of a base polysilicon layer. The second sub-step in step 2514 may include the formation, annealing, and polishing of a top polysilicon layer.

In step 2516, a portion of the third semiconductor layer of step 2514 may be etched. For example, as further discussed in connection with FIG. 11, a photolithography and etch process may be performed to etch positions of the third semiconductor layer to expose one or more of the polysilicon pedestals. For example, a photoresist may be patterned as a protective layer that covers pedestals that have no protrusions while leaving pedestals with protrusions exposed. Step 2516 may involve dry etching or chemical etching.

In step 2518, a conformal conductive layer may be formed. For example, as discussed in connection with FIGS. 12-13, a conductive layer may be formed conformally to cover exposed pedestals and the remaining portions of the third semiconductor layer. A metal layer like AlCu, TiN, TaN, AlSiCu, Cu, may be evaporated and after deposition perform photolithography and selective etch positions of the conductive layer. In some embodiments, the conductive layer may be formed so, as shown in FIGS. 12 and 18F) it fills ###recess regions in pedestals (such as recess regions 802A-802B, FIG. 8) and so that it forms bridges and/or cantilevers anchored (or based from) pedestals.

In step 2520, a protective layer (such as protective layer 1402) may be formed. For example, an oxide deposition may be performed in which at least some portions of the structure are covered by a dielectric layer (e.g., an oxide layer). In some embodiments, step 2520 may involve the deposition of multiple passivation dielectrics and a metal layer that are both used as a protective layer. In certain embodiments, step 2520 may involve the deposition of an oxide layer, a deposition of a silicon oxynitride layer, and a deposition of metal alloy. Additionally, or alternatively, step 2520 may involve annealing of materials in the structure. For example, step 2520 may involve annealing of materials after deposition.

In step 2522, a photoresist layer may be patterned over the conformal protective layer. For example, a new photoresist layer may be spin coated on the structure and then patterned to expose specific sections of the device. In some embodiments, the photoresist layer in step 2522 may have a thickness between 1 and 10 um.

In step 2524, deep etching of the structure may be performed to remove material from the regions not protected and perforate layers. For example, a DRIE and/or laser ablation may be used to etch through multiple layers of material to reach the oxide layer in the structure. The etch of step 2524 may open conduits for etchant to remove semiconductor layers that are not exposed.

In step 2526, one or more semiconductor layers may be etched for structure release. For example, a wet chemical etch may be used to etch away semiconductor layers and release comb electrodes for their free movement. In such embodiments, isotropic release etching may be performed to etch away holding structures and release elements with a determined vibration and/or movement range. In some embodiments, the release etch of step 2526 may be performed in through conduits to flow wet etchant, as further discussed in connection with FIGS. 16 and 19.

The disclosed devices and structures solve problems in the prior art by providing configurations that increase vibration and improve capacitive drive contact area in MEMS-drives. Prior art comb- or MEMS-drives, have shortcomings that limit displacement, limiting their sensitivity and ultimately their dynamic range. They are also prone to failure caused by vibration, and may have limited conductivity, which may limit their sensitivity and actuation. Disclosed configurations address these issues by improving the dynamic range of combs, enhancing robustness, and improving their conductivity for greater sensitivity. The disclosed devices and structures of electrodes or comb electrodes result in MEMS drives that may be both more sensitive and less prone to failures.

For example, disclosed devices and structure may provide more space for horizontal vibration, which may result in better sensitivity. The disclosed designs may allow designers to include additional horizontal vibration space as the structures may have a greater dynamic range based on the specific anchoring conditions and the shape of the device. The enhanced horizontal vibration permits better sensitivity and/or actuation. Further, the disclosed devices and structures result in combs or electrodes with more metal. The increase in metal improves conductivity and increases the area for capacitive sensing or actuation.

Moreover, the disclosed devices and structures avoid sudden vibration failures. Sudden or impulsive vibration refers to a sudden vibration with a certain amplitude and then sharp decay. This type of vibration is often caused by externalities (e.g., a drop or shock) and MEMS devices, in particular MEMS drives, frequently fail due to such sudden vibration. The disclosed devices and structures address this issue by providing a structure with improved robustness and resistance to sudden vibration. The disclosed use of protrusions in different arrangements enhances attachment and permits use of thicker electrodes that reduce failure risk caused by sudden vibration.

Moreover, the disclosed configurations can be adapted to different technologies. For example, disclosed embodiments of amplifiers may be implemented in various manufacturing processes including 3 nm, 5 nm, 7 nm, 10 nm, 16 nm, and 20 nm processes.

For at least these reasons, the advantages of the disclosed embodiments result in devices or structures with enhanced characteristics of sensitivity, robustness, and/or conductivity.

It will be understood that not all advantages have been necessarily discussed herein, no particular advantage is required for all embodiments or examples, and other embodiments or examples may offer different advantages.

According to one aspect of the present disclosure, a microdevice includes a first pedestal, a second pedestal parallel to the first pedestal (the second pedestal comprising a first protrusion on its top surface), a conformal dielectric layer over the first pedestal and the second pedestal and a metal structure formed over a portion of the conformal dielectric layer. The metal structure may include a plurality of portions including a first portion surrounding the first protrusion, a second portion parallel to the top surface of the polysilicon pedestal (where the second portion extends towards the first polysilicon pedestal, the second portion being higher and longer than the first portion) and a third portion connecting the first portion and the second portion.

According to another aspect of the present disclosure, a method for fabricating a microdevice may include forming a photoresist layer over a structure comprising a first pedestal and a second pedestal, patterning the photoresist layer on top of the first pedestal and the second pedestal, the photoresist layer exposing a portion of the second pedestal, partially etching the second polysilicon pedestal using an anisotropic etching process to form a protrusion, forming a polysilicon layer over the first pedestal and the second pedestal, etching the polysilicon layer to expose the protrusion, forming a conformal metallic layer over the polysilicon layer and the protrusion, patterning the conformal metallic layer; and etching the polysilicon layer to release the conformal metallic layer.

In accordance with yet another aspect of the present disclosure, a MEMS driving comb includes a plurality of combs arranged substantially in parallel, a protective layer over the plurality of combs; and a structure layer comprising a protrusion on its top surface. The protrusion may be located at least one micrometer from an edge of the polysilicon layer, the polysilicon layer being covered by a conformal dielectric layer. In the MEMS driving comb, each of the plurality of combs includes connections that surround the protrusion, a height of the protrusion may be at least 20% of the a width of the protrusion, the plurality of combs comprise at least one of AlCu, TiN, TaN, AlSiCu, or Cu, the plurality of combs have a comb width, a distance between combs of the plurality of combs is at least one-third of the comb width, and the protective layer comprises at least one of silicon oxide, silicon nitride, silicon carbide, fluorosilicate glass, undoped silicate glass, or borophosphosilicate glass.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, while illustrative embodiments have been described herein, the scope thereof includes any and all embodiments having equivalent elements, modifications, omissions, combinations (e.g., of aspects across various embodiments), adaptations and/or alterations as would be appreciated by those in the art based on the present disclosure. For example, the number and orientation of components shown in the exemplary systems may be modified. Further, with respect to the exemplary methods illustrated in the attached drawings, the order and sequence of steps may be modified, and steps may be added or deleted.

Thus, the foregoing description has been presented for purposes of illustration only. It is not exhaustive and is not limiting to the precise forms or embodiments disclosed. Modifications and adaptations will be apparent to those skilled in the art from consideration of the specification and practice of the disclosed embodiments.

The claims are to be interpreted broadly based on the language employed in the claims and not limited to examples described in the present specification, which examples are to be construed as non-exclusive. Further, the steps of the disclosed methods may be modified in any manner, including by reordering steps and/or inserting or deleting steps.

What is claimed is:

1. A microdevice comprising:

a first pedestal;

a second pedestal parallel to the first pedestal, the second pedestal comprising a first protrusion on its top surface;

a conformal dielectric layer over the first pedestal and the second pedestal; and a first metal structure formed over a portion of the conformal dielectric layer, the first metal structure comprising:

a first portion surrounding the first protrusion;

a second portion parallel to the top surface of the second pedestal, the second portion extending towards the first pedestal, the second portion being higher and longer than the first portion; and a third portion connecting the first portion and the second portion, a second metal structure parallel to the first metal structure, wherein the first metal structure and the second metal structure have a comb width, and a distance between the first metal structure and the second metal structure is greater than one-third of the comb width.

2. The microdevice of claim 1, wherein:

the first metal structure further comprises a fourth portion substantially parallel to the top surface of the second pedestal, the fourth portion extending away from the first pedestal, the fourth portion being at a substantially similar height of the second portion; and a fifth portion connecting the first portion and the fourth portion.

3. The microdevice of claim 2, further comprising a third pedestal comprising a second protrusion; and wherein the first metal structure further comprises:

a sixth portion surrounding the second protrusion; and a seventh portion connecting the fourth portion and the second portion; and wherein the first, second, and third pedestals comprise polysilicon.

4. The microdevice of claim 1, wherein the first protrusion is formed by etching the second pedestal.

5. The microdevice of claim 1, wherein a bottom area of the first protrusion is greater than a top area of the first protrusion.

6. The microdevice of claim 1, wherein a top area of the first protrusion is greater than a bottom area of the first protrusion.

7. The microdevice of claim 1, wherein the first protrusion comprises a trench and the first portion fills the trench.

8. The microdevice of claim 1, wherein the first metal structure is coated by a protective dielectric film, the protective dielectric film comprising at least one of silicon oxide, silicon nitride, silicon carbide, fluorosilicate glass, undoped silicate glass, or borophosphosilicate glass.

9. The microdevice of claim 1, wherein the first protrusion height is at least 20% of the first protrusion width.

10. A MEMS driving comb comprising:

a plurality of combs arranged substantially in parallel;

a protective layer over the plurality of combs; and a structure layer comprising a protrusion on its top surface, the protrusion being located at least one micrometer from an edge of the structure layer, the structure layer being covered by a conformal dielectric layer, wherein:

each of the plurality of combs comprise connections that surround the protrusion;

a height of the protrusion is at least 20% of a width of the protrusion;

the plurality of combs comprise at least one of AlCu, TiN, TaN, AlSiCu, or Cu;

the plurality of combs have a comb width;

a distance between combs of the plurality of combs is at least one-third of the comb width; and the protective layer comprises at least one of silicon oxide, silicon nitride, silicon carbide, fluorosilicate glass, undoped silicate glass, or borophosphosilicate glass.

11. The MEMS driving comb of claim 10, wherein the distance between combs of the plurality of combs is within 10%-30% of a comb length of the plurality of combs.

12. The MEMS driving comb of claim 10, wherein the protective layer comprises a protective dielectric film.

13. The MEMS driving comb of claim 10, wherein the structure layer comprises a first pedestal and a second pedestal parallel to the first pedestal.

14. The MEMS driving comb of claim 13, wherein the second pedestal comprises the protrusion on its top surface.

15. The MEMS driving comb of claim 14, further comprising:

a metal structure formed over a portion of the conformal dielectric layer.

16. The MEMS driving comb of claim 15, wherein the metal structure comprises:

a first portion surrounding the protrusion; and a second portion parallel to the top surface of the second pedestal.

17. The MEMS driving comb of claim 16, wherein the second portion extends towards the first pedestal.

18. The MEMS driving comb of claim 17, wherein the second portion is higher and longer than the first portion.

19. The MEMS driving comb of claim 16, wherein the metal structure further comprises:

a third portion connecting the first portion and the second portion.

20. A semiconductor device comprising:

a plurality of comb electrodes arranged substantially in parallel, wherein two adjacent comb electrodes are spaced apart by a pitch distance, and the pitch distance is greater than one-third of a comb width of the comb electrodes;

a protective layer covering the plurality of comb electrodes and comprising at least one of silicon oxide, silicon nitride, silicon carbide, fluorosilicate glass, undoped silicate glass, or borophosphosilicate glass;

a structure layer comprising a protrusion on a top surface of the structure layer, wherein a height of the protrusion is at least 20% of a width of the protrusion; and a conformal dielectric layer covering the structure layer.

* * * * *